United States Patent
Dohmen et al.

(10) Patent No.: US 8,458,575 B2
(45) Date of Patent: Jun. 4, 2013

(54) HIGH SPEED SYNDROME-BASED FEC ENCODER AND SYSTEM USING SAME

(75) Inventors: Ralf Dohmen, Nuremberg (DE); Timo Frithjof Schuering, Nuremberg (DE); Leilei Song, Eatontown, NJ (US); Meng-Lin Mark Yu, Morganville, NJ (US)

(73) Assignees: Agere Systems LLC, Allentown, PA (US); Alcatel-Lucent USA Inc., Murray Hill, NJ (US)

( * ) Notice: Subject to any disclaimer, the term of this patent is extended or adjusted under 35 U.S.C. 154(b) by 1148 days.

(21) Appl. No.: 12/370,739

(22) Filed: Feb. 13, 2009

(65) Prior Publication Data

US 2009/0150754 A1 Jun. 11, 2009

Related U.S. Application Data

(62) Division of application No. 11/129,193, filed on May 13, 2005, now Pat. No. 7,509,564, which is a division of application No. 09/976,729, filed on Oct. 12, 2001, now Pat. No. 6,990,624.

(51) Int. Cl.
*H03M 13/00* (2006.01)

(52) U.S. Cl.
USPC .......................... 714/782; 714/784; 714/757

(58) Field of Classification Search
USPC ........................ 714/782, 784, 757
See application file for complete search history.

(56) References Cited

U.S. PATENT DOCUMENTS

| | | | | |
|---|---|---|---|---|
| 4,336,612 A * | 6/1982 | Inoue et al. | ..... | 714/755 |
| 4,665,523 A * | 5/1987 | Citron et al. | ..... | 714/785 |
| 5,168,509 A * | 12/1992 | Nakamura et al. | ..... | 375/286 |
| 5,291,496 A * | 3/1994 | Andaleon et al. | ..... | 714/703 |
| 5,473,611 A * | 12/1995 | Gilboa et al. | ..... | 370/506 |
| 5,526,368 A | 6/1996 | Yun | | |
| 5,537,429 A * | 7/1996 | Inoue | ..... | 714/755 |
| 5,734,962 A * | 3/1998 | Hladik et al. | ..... | 455/12.1 |
| 5,754,563 A * | 5/1998 | White | ..... | 714/757 |
| 5,930,273 A * | 7/1999 | Mukojima | ..... | 714/776 |
| 5,983,383 A * | 11/1999 | Wolf | ..... | 714/755 |
| 5,996,104 A * | 11/1999 | Herzberg | ..... | 714/755 |
| 6,023,783 A * | 2/2000 | Divsalar et al. | ..... | 714/792 |
| 6,029,264 A * | 2/2000 | Kobayashi et al. | ..... | 714/755 |
| 6,031,874 A * | 2/2000 | Chennakeshu et al. | ..... | 375/262 |
| 6,088,387 A * | 7/2000 | Gelblum et al. | ..... | 375/222 |
| 6,157,642 A * | 12/2000 | Sturza et al. | ..... | 370/389 |
| 6,189,123 B1 * | 2/2001 | Anders Nystrom et al. | ..... | 714/751 |
| 6,208,699 B1 * | 3/2001 | Chen et al. | ..... | 375/340 |
| 6,233,077 B1 * | 5/2001 | Alexander et al. | ..... | 398/79 |

(Continued)

OTHER PUBLICATIONS

Mastrovito, "VLSI Designs for Multiplication Over Finite Fields GF(2m)," Int'l Conf. On Applied Algebra, Algebraic Algorithms, and Error-Correcting Codes, pp. 297-309, Rome (Jul. 1988).

*Primary Examiner* — Joseph D Torres
(74) *Attorney, Agent, or Firm* — Ryan, Mason & Lewis, LLP

(57) ABSTRACT

A decoder, encoder and corresponding system are disclosed for providing fast Forward Error Correcting (FEC) decoding and encoding of syndrome-based error correcting codes. Three-parallel processing is performed by elements of the system. More particularly, in an illustrative embodiment, a decoder performs three-parallel syndrome generation and error determination and calculations, and an encoder performs three-parallel encoding. Low power and complexity techniques are used to save cost and power yet provide relatively high speed encoding and decoding.

6 Claims, 22 Drawing Sheets

U.S. PATENT DOCUMENTS

| | | | |
|---|---|---|---|
| 6,263,466 B1 * | 7/2001 | Hinedi et al. | 714/755 |
| 6,311,236 B1 * | 10/2001 | Oeda et al. | 710/34 |
| 6,353,909 B1 * | 3/2002 | Amrany et al. | 714/757 |
| 6,530,057 B1 * | 3/2003 | Kimmitt | 714/758 |
| 6,560,748 B2 * | 5/2003 | Li | 714/786 |
| 6,571,368 B1 | 5/2003 | Chen | |
| 6,598,203 B1 * | 7/2003 | Tang | 714/790 |
| 6,658,605 B1 * | 12/2003 | Yoshida et al. | 714/702 |
| 6,675,348 B1 * | 1/2004 | Hammons et al. | 714/790 |
| 6,701,478 B1 * | 3/2004 | Yang et al. | 714/757 |
| 6,731,878 B1 * | 5/2004 | Britz et al. | 398/96 |
| 6,738,942 B1 * | 5/2004 | Sridharan et al. | 714/755 |
| 6,810,499 B2 * | 10/2004 | Sridharan et al. | 714/755 |

* cited by examiner

| NAME | DIRECTION | WIDTH | DESCRIPTION |
|---|---|---|---|
| c111_orx | IN | std_ulogic | SYSTEM CLOCK, 111 MHz |
| r111_orx | IN | std_ulogic | SIGNAL FOR SYNCHRONOUS RESET OF DECODER |
| d111rx_ode | IN | (383 DOWN TO 0) | INPUT ENCODED DATA |
| p111rx_ode | IN | std_ulogic | START OF INPUT FEC BLOCK PULSE |
| o_decdis | IN | std_ulogic | DECODER FUNCTION ENABLE ('1' = DECODER IS DISABLED) |
| o_corinh | IN | std_ulogic | ERROR CORRECTION ENABLE ('1' = ERROR CORRECTION INHIBITED) |
| d111rx_fdc | BUFFER | (383 DOWN TO 0) | OUTPUT DECODED DATA |
| d111rx_fdc_corval | BUFFER | (383 DOWN TO 0) | OUTPUT CORRECTION VALUES: THIS SIGNAL INDICATES THE BIT POSITION IN THE DATA STREAM d111rx_fdc WHERE A BIT HAS BEEN CORRECTED (VALUES: '0' = NO CORRECTION; '1' = CORRECTION) |
| p111rx_fdc | BUFFER | std_logic | PULSE INDICATING THE START OF AN OUTPUT FEC BLOCK |
| d111rx_fdc_errors | BUFFER | (10 DOWN TO 0) | NUMBER OF CORRECTED BIT ERRORS WITHIN ONE FRAME |
| d111rx_fdc_errovfl | BUFFER | (4 DOWN TO 0) | NUMBER OF UNCORRECTABLE BLOCKS WITHIN ONE FRAME |

FIG. 6

| NAME | DIRECTION | WIDTH | DESCRIPTION |
|---|---|---|---|
| c111_otx | IN | std_ulogic | SYSTEM CLOCK, 111 MHz |
| r111_otx | IN | std_ulogic | SIGNAL FOR SYNCHRONOUS RESET OF ENCODER |
| d111tx_otx | IN | (383 DOWN TO 0) | INPUT DATA |
| p111tx_otx | IN | std_ulogic | START OF INPUT FEC BLOCK PULSE |
| d111tx_fco | BUFFER | (383 DOWN TO 0) | OUTPUT ENCODED DATA |
| p111tx_fco | BUFFER | std_ulogic | PULSE INDICATING THE END OF AN FEC BLOCK |

HIGH SPEED SYNDROME-BASED FEC ENCODER AND SYSTEM USING SAME

CROSS REFERENCE TO RELATED APPLICATIONS

This application is a divisional of U.S. patent application Ser. No. 11/129,193, filed May 13, 2005, which is a divisional of U.S. patent application No. 09/976,729, filed Oct. 12, 2001, each incorporated by reference herein.

FIELD OF THE INVENTION

The present invention relates generally to digital error correction, and more particularly, to high speed syndrome-based encoders and decoders that support parallel Forward Error Correction (FEC) codeword encoding and decoding, respectively.

BACKGROUND OF THE INVENTION

Forward Error Correction (FEC) codes are commonly used in a wide variety of communication systems. For example, such codes can be used in optical communication systems to provide significant power gains within the overall optical power budget of an optical communication link. At the same time, FEC codes lower the Bit Error Rate (BER) of the optical communication link. The resulting gain obtained through the use of the FEC technique can be exploited for either increasing the repeater distances, thereby relaxing optical components and line fiber specifications, or improving the overall quality of communication. For optical communication systems, a high rate error correction code is desirable, as long as the code has large coding gain and can correct both random and burst errors.

One particularly important FEC code is a Reed-Solomon (RS) code. RS codes are maximum distance separable codes, which means that code vectors are maximally separated in a multi-dimensional space. The maximum distance separable property and symbol-level encoding and decoding of RS code make it an excellent candidate for correcting both random and burst errors. In fact, an eight-byte error correcting RS code is recommended as a strong FEC solution for some optical submarine systems. This is due to not only the good random and burst error correcting capability of this code, but also the availability of relatively low complexity encoding and decoding algorithms.

In fact, the Standardization Sector of the International Telecommunication Union, commonly abbreviated as ITU-T, has adopted a RS(255,239) code. This RS(255,239) code means that 255 total symbols are transmitted, of which 239 symbols are information symbols and 16 (i.e., 255-239) are redundancy symbols that contain information that enables error correction. A frame format 100 for this RS code is shown in FIG. 1. Frame format 100 comprises 16 rows and 255 columns. Each entry of a row or column is one symbol, which is a byte in the ITU-T standard. Each row has one codeword of 255 symbols, divided into one byte of protocol overhead 110, 238 bytes of payload 120, and 16 bytes of redundancy bytes 130.

When frame format 100 is transmitted, it is transmitted in a particular order. This order is shown in transmission format 170. Basically, each column of frame format 100 is transmitted beginning with the first row of the first column (i.e., byte 140) and ending with the last row of the last column (i.e., byte 160). Consequently, byte 140 is transmitted in the first position, byte 145 is transmitted in position 16, byte 150 is transmitted in position 3,825, and byte 160, the final byte, is transmitted in position 4080. This transmission scheme is chosen mainly to reduce burst errors, as these types of errors would be spread over several codewords.

A receiver would receive transmission format 170 as byte 140 through byte 160, with byte 140 arriving first and byte 160 arriving last. The receiver has to reassemble codewords (i.e., codewords 1 through 16 of frame format 100) from frame format 100 in order to be able to correct errors in each codeword.

Although the ITU-T details the frame format 100 and the transmission format 170, the actual implementation of decoders and encoders to receive and transmit, respectively, information using the formats are not specified and remain design choices. For instance, a single encoder could be used to create the codewords in rows 1 through 16. Alternatively, 16 encoders could be used to create the codewords in rows 1 through 16. Although using 16 encoders increases the speed of encoding, this many encoders also increases complexity, power, and cost.

Components for encoding and decoding RS codes are readily available for throughput rates below one Gigabits per second (Gb/s). However, as the data rate increases to 10 Gb/s and beyond, increases in power consumption and complexity of these FEC devices are the main barriers to integrating them into optical communication systems at relatively low cost. Consequently, a problem with implementing a transmission scheme, such as that shown in FIG. 1, involving FEC codes is meeting the required power, complexity, and speed at an appropriate cost.

A need therefore exists for techniques that allow high speed FEC and yet offer relatively low power, complexity, and cost.

SUMMARY OF THE INVENTION

Generally, the present invention provides a system and encoders and decoders that support very high speed encoding and decoding of symbol-based Forward Error Correcting (FEC) codes, yet provides relatively low power, complexity, and cost.

In one aspect of the invention, a decoder module creates a parallel data stream from a received serial data stream. The parallel data stream is operated on in a three-parallel format, whereby three symbols are used in parallel by a number of devices in the decoder module. For instance, multiple three-parallel syndrome generators may operate in parallel, with each three-parallel syndrome generator adapted to perform calculations on three received symbols of one received data word during one cycle.

In another aspect of the invention, an encoder module performs three parallel encoding. In other aspects of the invention, three-parallel frames are created. During decoding, symbols from the three-parallel frames are routed to appropriate three-parallel syndrome generators in such as way as to allow fast transfers from the three-parallel frame to the three-parallel syndrome generators.

In another aspect of the invention, low complexity multipliers and dividers are used, which decrease power consumption and cost yet allow high speed. Additionally, multiplications in a key equation solving device are used instead of division to reduce complexity and increase speed.

In another aspect of the invention, the decoder module can turn off decoding or turn off error correction. This may be used, for instance, if the number of errors over a predetermined time period is small. Additionally, an FEC decoder can be placed into a low power mode if certain criteria are met.

In yet another aspect of the invention, an error signal is output from the decoder module. This error signal allows a peripheral to determine locations and amount of errors, and allows error analyses to be performed.

A more complete understanding of the present invention, as well as further features and advantages of the present invention, will be obtained by reference to the following detailed description and drawings.

BRIEF DESCRIPTION OF THE DRAWINGS

FIG. 6 is a description of the input/output signals shown in FIG. 5, in accordance with a preferred embodiment of the invention;

DETAILED DESCRIPTION

Figure 1:
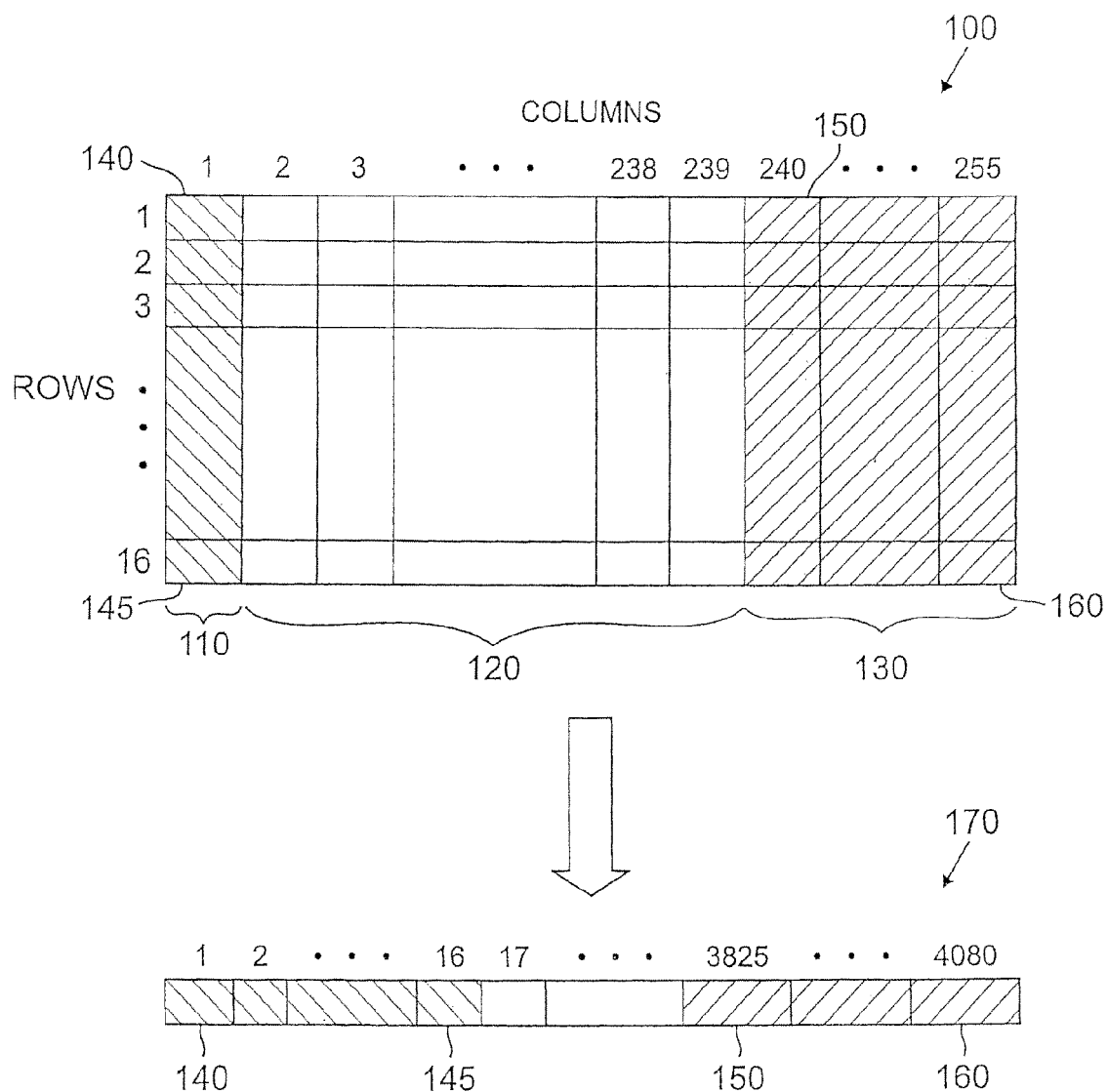
FIG. 1 is a block diagram of prior art frame and transmission formats.

Aspects of the present invention reduce power and complexity in systems using Forward Error Correction (FEC). For Reed-Solomon (RS) codes, in particular, the present invention reduces power and complexity and at the same time provides high speed during encoding and decoding.

By way of introducing the techniques of the present invention, a limited explanation of conventional encoding and decoding of RS codes will initially be provided. A more detailed description of encoding and decoding of RS codes is given in the copending United States patent application entitled "Low Complexity and Low Power FEC Supporting High Speed Parallel Decoding of Syndrome-Based FEC Codes," Attorney Docket Number Song 3, filed contemporaneously herewith and incorporated by reference herein.

RS Codes: Encoding

An RS code is a linear cyclic code and, hence, can be defined by its generator polynomial G(x). RS codes are generally characterized by how many symbols are needed to carry the data and the error correcting symbols, and how many errors the code can correct. This is generally written as (n, k), where n is the total number of symbols, including error correcting symbols and data symbols, and k is the number of data symbols. An (n, k) code will correct t errors, where t=(n−k)/2. Thus, an RS(255,239) code has 255 total symbols, of which 255−239=16 symbols are error correcting symbols and 239 symbols are data symbols. This code will correct up to t=(255−239)/2, or 8 symbol errors.

The generator polynomial for a t error-correcting RS code over Galois field $GF(2^m)$ is chosen such that 2t consecutive powers of α are roots of G(x) as follows:

$$G(x) = \prod_{i=0}^{2t-1} (x - \alpha^i), \quad (1)$$

where α is a root of a binary primitive polynomial p(x) of degree m that generates the extension field $GF(2^m)$. All the valid codeword polynomials are multiples of G(x).

Suppose that $u(x)=u_{k-1}x^{k-1}+\ldots u_1x+u_0$ is an information polynomial with symbols coming from $GF(2^m)$. Then the nonsystematic codeword polynomial is as follows:

$$c(x)=u(x)G(x). \quad (2)$$

Systematic encoding is generally used, since information symbols appear clearly in the codeword. The systematic codeword polynomial is as follows:

$$c(x)=u(x)\cdot x^{n-k}+<u(x)\cdot x^{n-k}>_{G(x)}, \quad (3)$$

where $<\cdot>_{G(x)}$ denotes the remainder polynomial after division by G(x). It is not difficult to verify that the codeword polynomial obtained in such a way is a multiple of G(x). Hence, encoding of an RS code involves only polynomial long divisions over $GF(2^m)$. A serial RS encoder can be implemented using a linear feedback shift register, which has a throughput rate of one symbol per cycle. This can be sped up by processing multiple symbols per cycle.

The generator polynomial for an RS(255,239) code, which is an important RS code used by the Standardization Sector of the International Telecommunication Union, commonly abbreviated as ITU-T, is as follows:

$$G(x) = \prod_{i=0}^{15}(x - \alpha^i). \quad (4)$$

$$G(x) = x^{16} + \alpha^{120}x^{15} + \alpha^{104}x^{14} + \alpha^{107}x^{13} + \alpha^{109}x^{12} + \\ \alpha^{102}x^{11} + \alpha^{161}x^{10} + \alpha^{76}x^9 + \alpha^3 x^8 + \alpha^{91}x^7 + \alpha^{191}x^6 + \\ \alpha^{147}x^5 + \alpha^{169}x^4 + \alpha^{182}x^3 + \alpha^{194}x^2 + \alpha^{225}x + \alpha^{120} \quad (5)$$

A three-parallel implementation of an encoder for generating codewords from the G(x) of Equations (4) and (5) is described below.

RS Codes: Decoding

Suppose c(x), r(x) and e(x) are the transmitted codeword polynomial, the received polynomial and the error polynomial, respectively, with the relation r(x)=c(x)+e(x). Let $X_l$ and $Y_l$ denote the error locations and error values, respectively, where $1 \leq l \leq t$, and $X_l = \alpha^i_l$.

Figure 2:
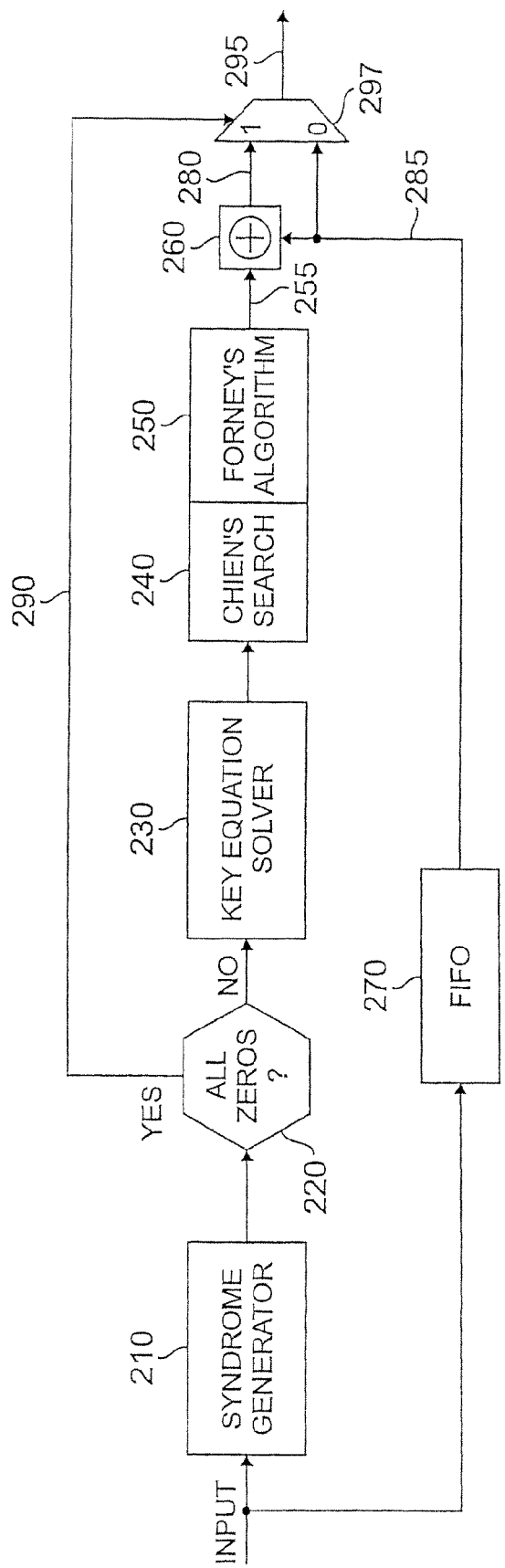
FIG. 2 is a block diagram of a prior art Reed-Solomon (RS) decoder.

Conventional syndrome-based RS decoding comprises three steps: (i) compute the syndromes; (ii) solve a key equation for the error locator and error evaluator polynomials; and (iii) compute the error locations and error values using Chien's search and Forney's algorithm. A block diagram of one RS decoder that incorporates these steps is shown in FIG. 2. RS decoder 200 comprises a syndrome generator 210, a test 220, a key equation solving block 230, a Chien's search 240, a Forney's algorithm 250, a GF adder 260, a First In First Out (FIFO) block 270, corrected output 280, a selector output 290, uncorrected output 285, and RS decoder output 295, and multiplexer (MUX) 297. When data comes in, it passes through the syndrome generator 210, which determines syndromes that are tested in test block 220. If the syndromes are not all zero, they are sent to the key equation solving block 230 and processed. The result is then passed through Chien's search 240 and Forney's algorithm 250. The output 255 of Forney's algorithm 240 is added, through adder 260, to a delayed version of the input (i.e., uncorrected output 270) that comes through FIFO 270. In this scenario, corrected output 280 will be a corrected version of the input, the selector output 290 will be a predetermined value such that MUX 297 selects corrected output 280. The RS decoder output 295 will thus be the corrected version of the input (i.e., corrected output 280). If all the syndromes are zero in test 220, then selector output 290 is used to signal that there are no errors, and selector output 290 is set to a predetermined value such that MUX 297 outputs uncorrected output 285. Essentially, the corrected output 280 is ignored under these circumstances, and the RS decoder output 295 is the uncorrected output 285 (i.e., the incoming data are output unaltered).

It should be noted that it is possible for errors to occur but for test 220 to indicate that no errors occurred. For example, one codeword could be transmitted and be corrupted such that it is converted into another valid codeword. However, the maximal separability property of RS codes helps to minimize this possibility.

The syndrome generator block 210 begins, when decoding a t error correcting RS code, by computing the 2t syndromes defined as follows:

$$S_j = r(\alpha^j) = \sum_{i=0}^{n-1} r_i (\alpha^j)^i, \quad (6)$$

for $0 \leq j \leq 2t-1$. Note that every valid codeword polynomial has $\alpha^0, \alpha, \ldots, \alpha^{2t-1}$ as roots and hence the syndromes of each valid codeword equal zero. Therefore, the syndromes of the received polynomial can also be written as follows:

$$s_j = e(\alpha^j) = \sum_{i=0}^{n-1} e_i(\alpha^j)^i = \sum_{l=1}^{t} Y_l X_l^j, \quad (7)$$

where $Y_l$ and $X_l$ denote the error value and error location, respectively. Equation (7) reflects the errors contained in the received polynomial. Define $S(x)=S_0+S_1x+\ldots+S_{2t-1}x^{2t-1}$ as the syndrome polynomial.

A serial implementation of syndrome computation requires 2t constant multipliers, and has a latency of n clock cycles. A parallel implementation of a syndrome calculation may also be performed. An l-level parallel implementation processes l received symbols every clock cycle. This type of design speeds up the computation by l times at the expense of an l-fold increase in hardware complexity. A three-parallel architecture, in accordance with a preferred embodiment of the invention, is described below for computing the syndromes.

After the syndromes are computed and if they are not all zero, the second step of RS decoding is to solve a key equation for error polynomials. This occurs in block 230 of FIG. 2. Define an error locator polynomial $\Lambda(x)$ as the following:

$$\Lambda(x)=\Pi(1-X_l x), \quad (8)$$

i.e., $\Lambda(X_l^{-1})=0$ for every error location $X_l$. The key equation for RS decoding is defined as the following:

$$S(x) \cdot \Lambda(x) = \Omega(x) \bmod x^{2t}, \quad (9)$$

where $\Omega(x)$ is an error evaluator polynomial and can be used to compute the error values. The degree of $\Omega(x)$ is less than t. Given the syndrome polynomial S(x), the error locator and error evaluator polynomials can be solved simultaneously from Equation (9). Algorithms and architectures for solving the key equation are quite complex.

Once $\Lambda(x)$ and $\Omega(x)$ have been found, an RS decoder can search for the error locations by checking whether $\Lambda(\alpha^i)=0$ for each i, $1 \leq i \leq n$. This occurs in blocks 240 and 250 of FIG. 2. In the case when an error location is found at $X_l = \alpha^{-i_l}$ (or $\alpha^{n-i_l}$ with $n=2^m-1$), the corresponding error value can be calculated using Forney's algorithm as follows:

$$Y_l = \frac{\Omega(x)}{x\Lambda'(x)}\bigg|_{x=X_l^{(-1)}=\alpha^{i_l}}, \quad (10)$$

where $\Lambda'(x)$ is the formal derivative of $\Lambda(x)$ and $$x\Lambda'(x)=\Lambda_1 x+\Lambda_3 x^3+\ldots+\Lambda_{t-1}x^{t-1}, \quad (11)$$

comprises all of the odd terms of $\Lambda(x)$. Let $\Lambda0(x)$ and $\Lambda1(x)$ denote the polynomials comprising even and odd terms of $\Lambda(x)$, respectively. Usually, the decoder incrementally evaluates $\Omega(x)$, $\Lambda0(x)$, and $\Lambda1(x)$ at $x=\alpha^i$ for $i=1, 2, \ldots, n$, computes the error values, and performs error correction on the (n−i) received symbol before it leaves the decoder. This is the above-noted Chien's search. In other words, Chien's search is used to determine where an error occurs, while Forney's algorithm is used to determine the corresponding error value. This sequential error correction process is summarized as follows, where $\{c_i\}$ is the decoded output sequence:

For i = 1 to n
   If $(\Lambda(\alpha^i) == 0)$ then
$$\hat{c}_{n-i} = r_{n-i} + \frac{\Omega(\alpha^i)}{\Lambda 1(\alpha^i)}$$
   End If
End For A serial implementation of Chien's search and Forney's algorithm performs error correction on the (n−i) symbol in the i-th clock cycle, for i=1, 2, ..., n. It requires 15 constant multiplications and additions for evaluating $\Omega(x)$, $\Lambda 0(x)$, and $\Lambda 1(x)$ at $x=\alpha^i$. Low complexity improvements to an implementation Forney's algorithm are described below.

The key equation, Equation (9), can be solved using either Berlekamp-Massey algorithm or the Euclidean algorithm, both of which are well known in the art. Descriptions of implementations of both the Euclidean algorithm and the Berlekamp-Massey algorithm are found in Blahut, "Theory and Practice of Error Control Codes," Addison Wesley (1984), the disclosure of which is incorporated by reference herein. Both of the above-noted algorithms find the error polynomials within 2t iterations and each iteration requires Galois field multiplication and division and has a computation delay of at least one multiplication and one division delay. Consequently, these conventional algorithms are not suitable for high speed implementations.

Fortunately, the division operations in both of the above-noted algorithms can be replaced by multiplications, and the resulting error polynomials are different from those computed using the original algorithms only by a scaling factor, which does not change the computation of error locations and error values. A modified division-free Euclidean algorithm has been proposed for RS decoding. This is described in Shao et al., "VLSI Design of a Pipeline Reed-Solomon Decoder," IEEE Trans. on Computers, vol. c-34, 393-403, (May 1985), the disclosure of which is incorporated by reference herein. Division-free Berlekamp-Massey algorithms can be found in Shayan et al., "Modified Time-Domain Algorithm for Decoding Reed-Solomon Codes," IEEE Trans. on Comm., vol. 41, 1036-1038 (1993); and Song et al., "Low-energy software Reed-Solomon Codecs Using Specialized Finite Field Datapath and Division-Free Berlekamp-Massey algorithm," in Proc. of IEEE International Symposium on Circuits and Systems, Orlando, Fla. (May 1999), the disclosures of which are incorporated by reference herein.

The conventional modified Euclidean algorithm, described below, is more suitable for high speed, low power decoding of RS codes for the following reasons: (1) the loop delay of the modified Euclidean algorithm is half that of the division-free Berlekamp-Masey algorithm; and (2) the division-free Berlekamp-Masey algorithm cannot be terminated earlier even if the actual number of errors is less than t because the computation of discrepancy needs to be carried out for 2t iterations. The latter means that significant power savings, described in more detail below, generally cannot be realized with the Berlekamp-Masey algorithm. Consequently, the Berlekamp-Masey algorithm will not be further described herein.

RS Codes: Modified Euclidean Algorithm

Originally, the Euclidean algorithm was used to compute the Greatest Common Divisor (GCD) of two polynomials. For RS decoding, the Euclidean algorithm starts with the polynomials $S(x)$ and $x^{2t}$, and solves the key equation through continuous polynomial division and multiplication. The main idea of the modified Euclidean algorithm is to replace polynomial division by cross multiplications. The algorithm is as follows.

Initially, let $R^{(0)}(x)=x^{2t}$, $Q^{(0)}(x)=S(x)$, $F^{(0)}(x)=0$, and $G^{(0)}(x)=1$. In the r-th iteration, update the polynomials $R^{(r+1)}(x)$, $Q^{(r+1)}(x)$, $F^{(r+1)}(x)$, and $G^{(r+1)}(x)$ as follows.

First, calculate $$l = \deg(R^{(r)}(x)) - \deg(Q^{(r)}(x)). \quad (12)$$

Then if $l \geq 0$, let $$E^{(r)} = \begin{bmatrix} Q_{msb} & -R_{msb} \cdot x^{|l|} \\ 0 & 1 \end{bmatrix}, \quad (13)$$

else, let $$E^{(r)} = \begin{bmatrix} -Q_{msb} \cdot x^{|l|} & R_{msb} \\ 1 & 0 \end{bmatrix}, \quad (14)$$

where $R_{msb}$ and $Q_{msb}$ are the leading coefficients of $R^{(r)}(x)$ and $Q^{(r)}(x)$, respectively. Next, update the intermediate polynomials using $$\begin{bmatrix} R^{(r+1)} \\ Q^{(r+1)} \end{bmatrix} = E^{(r)} \cdot \begin{bmatrix} R^{(r)} \\ Q^{(r)} \end{bmatrix}; \begin{bmatrix} F^{(r+1)} \\ G^{(r+1)} \end{bmatrix} = E^{(r)} \cdot \begin{bmatrix} F^{(r)} \\ G^{(r)} \end{bmatrix}. \quad (15)$$

Stop if $\deg(R^{(r+1)})(x)) < t$ or if $\deg(Q^{(r+1)}(x)) < t$. The resulting error polynomials are $\Lambda(x) = F^{(r+1)}(x)$ and $\Omega(x) = R^{(r+1)}(x)$. The computation stops within 2t iterations.

Note that computations in $E^{(r)}$ are cross multiplications. Applying $E_{(r)}$ to $R^{(r)}(x)$ and $Q^{(r)}(x)$ guarantees that the degree of the resulting $R^{(r+1)}(x)$ satisfies $$\deg(R^{(r+1)}(x)) \leq \max\{\deg(R^{(r)}(x)), \deg(Q^{(r)}(x))\} - 1,$$
$$\deg(Q^{(r+1)}(x)) = \min\{\deg(R^{(r)}(x)), \deg(Q^{(r)}(x))\}, \quad (16)$$

or $$\deg(R^{(r+1)}(x)) + \deg(Q^{(r+1)})(x)) \leq \deg(R^{(r)}(x)) + \deg(Q^{(r)}(x)) - 1. \quad (17)$$

Therefore, after 2t iterations, the following results:

$$\deg(R^{(2t)}(x)) + \deg(Q^{(2t)}(x)) \leq \deg(R^{(2t-1)}(x)) + \deg(Q^{(2t-1)}(x)) - 1 \leq \deg(R^{(0)}(x)) + \deg(Q^{(0)}(x)) - (2t) = 2t - 1. \quad (18)$$

Hence, one of the two polynomials, $R^{(2t)}(x)$ and $Q^{(2t)}(x)$, has degree less than t. It should be $R^{(2t)}(x)$ unless $\deg(Q^{(0)}) < t$, which is impossible when the number of errors is less than or equal to t. This guarantees that the algorithm stops within 2t iterations.

Let $E^{(r)} = \Pi_{i=0}^{r} E^{(i)}$. Then in each iteration, the following results:

$$\begin{bmatrix} R^{(r+1)}(x) \\ Q^{(r+1)}(x) \end{bmatrix} = E^{(r)} \cdot \begin{bmatrix} x^{2t} \\ S(x) \end{bmatrix}; \begin{bmatrix} F^{(r+1)}(x) \\ G^{(r+1)}(x) \end{bmatrix} = E^{(r)} \cdot \begin{bmatrix} 0 \\ 1 \end{bmatrix}, \quad (19)$$

or $$R^{(r+1)}(x) = F^{(r+1)}(x) \cdot S(x) \bmod x^{2t}, Q^{(r+1)}(x) = G^{(r+1)}(x) \cdot S(x) \bmod x^{2t}. \quad (20)$$

When the number of errors is less than or equal to t, the solution (e.g., the error locator polynomial and the error evaluator polynomial) to the key equation is unique up to a scaling factor. Therefore, the resulting polynomial $R^{(2t)}(x)$ of degree less than t is the error evaluator polynomial, and $F^{(2t)}(x)$ is the error locator polynomial.

Song 3, which has been incorporated by reference, describes the data dependency in the modified Euclidean algorithm and also describes a parallel decoder structure that implements the modified Euclidean algorithm. This parallel decoder structure has low power options and is designed for low complexity. To decrease the complexity, the present invention uses low complexity multipliers for the (6t+2) Galois field multipliers used in the modified Euclidean algorithm. This is described in more detail below.

System for Receiving and Transmitting Optical Data

As previously described in reference to FIG. 1, the ITU-T has defined frame formats for an RS(255,239) code. A challenge that remains is to create encoders and decoders that can use these frame formats for high speed applications, yet also provide relatively low power consumption and low cost. Aspects of the present invention fulfill these requirements by reducing complexity during various stages performed by the encoder and decoder. Anytime that complexity is reduced, power will also generally be reduced, cost will decline, and yet throughput can increase for a selected power and cost. Moreover, the present invention provides three-parallel architecture for the encoder and decoder. The three-parallel architecture reduces control complexity because the location of bytes within each frame is fixed and reduces the speed of operation of individual components in the encoder and decoder modules. The three-parallel architecture also allows high throughput with a relatively small increase in complexity to meet high throughput. Additionally, an aspect of the present invention can reduce power by completely disabling error decoding, should errors meet a predetermined value. Moreover, embodiments of the present invention provide several signals to outside components so that the outside components can perform error analyses on the channel.

Figure 3:
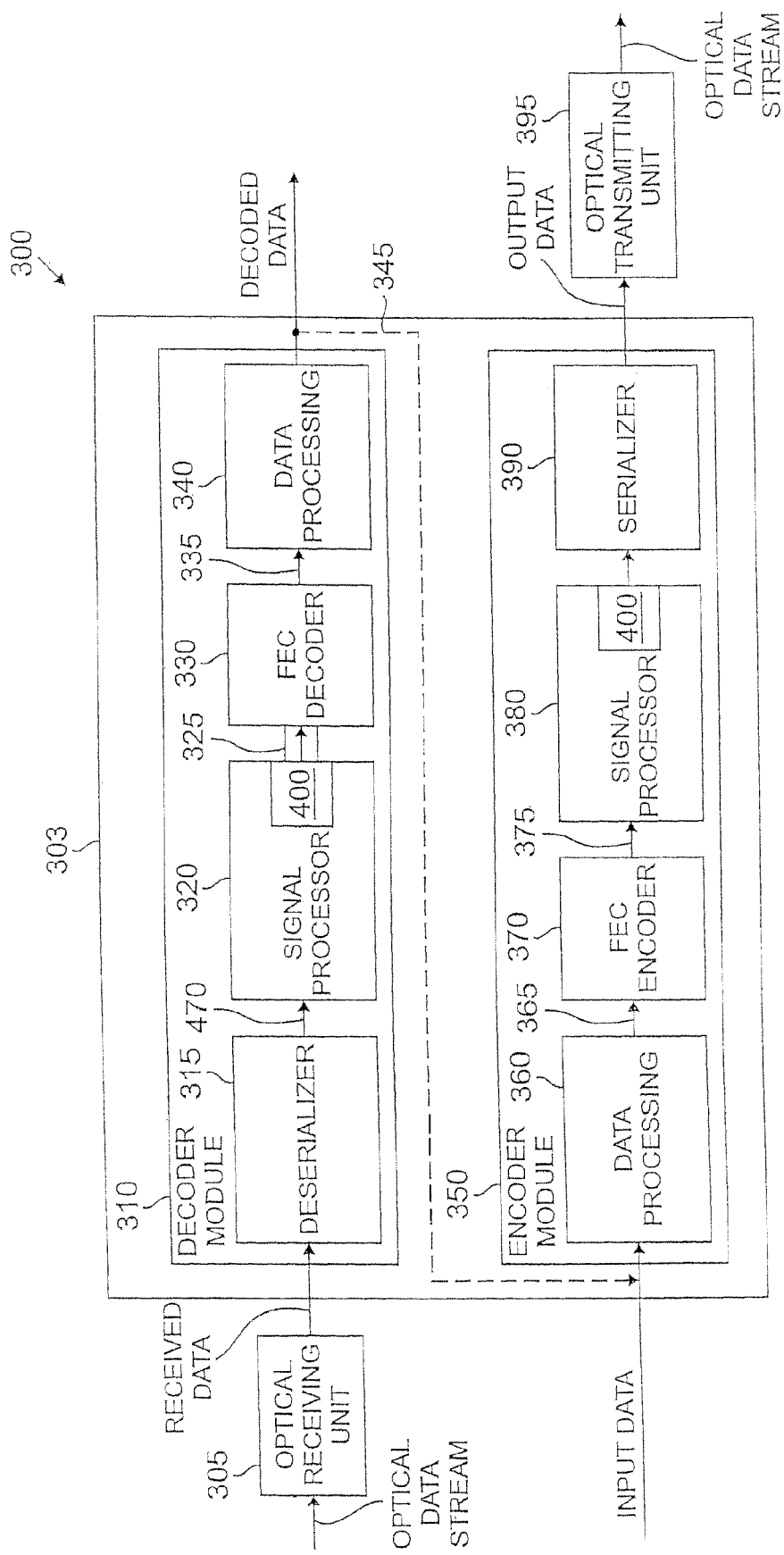
FIG. 3 is a block diagram of a system for transmitting and receiving optical data in accordance with a preferred embodiment of the invention.

Referring to FIG. 3, a system 300 for transmitting and receiving optical data is shown. System 300 comprises an optical receiving unit 305, an encoder and decoder module 303, and an optical transmitting unit 395. Encoder and decoder module 303 comprises decoder module 310 and encoder module 350. Decoder module 310 comprises a deserializer 315, a synchronizer and signal processor 320, an FEC decoder 330, and a data processing block 340. Encoder module 350 comprises a data processing block 360, an FEC encoder 370, a synchronizer and signal processor 380, and a serializer 390.

In this example, the encoder and decoder module 303 is used for receiving a stream of received data, creating decoded data from the received data, and resending the received data as output data. As such, the module 303 will generally be an Application Specific Integrated Circuit (ASIC). However, the decoder module 310 and encoder module 350 can be separated into physically distinct components not connected through a substrate.

Optical receiving unit 305 receives optical data and converts this data to electrical signals, as received data. As described above in reference to FIG. 1, data from an input frame (i.e., frame format 100 of FIG. 1) is transmitted serially. The optical receiving unit 305 receives an optical representation of this serial data and converts this optical representation to an electronic representation. It should be noted that the received data can be a serial bit stream or can be a serial symbol stream. In an embodiment of the present invention, the received data operates at 40 gigabits per second (Gb/s) of payload data. This data rate is derived from a Synchronous Optical Network (SONET) data rate of about 39.81 Gb/s. With an overhead byte per data word and 16 bytes of parity check bits (also called "redundancy bits" herein) per data word, the received data operates at about 43 Gb/s. For the SONET data rate of 39.81 Gb/s, the resulting higher rate is 39.81 Gb/s multiplied by 255/239, which is 42.47 Gb/s. In a G.709 standard (a standard by the ITU-T, which is a Telecommunication Standardization Section of the International Telecommunications Union), the client data rate is higher. More particularly, for the G.709 standard, the resulting data rate is 39.81 Gb/s multiplied by (255/239) multiplied by (239/236), which is 43.015 Gb/s.

Deserializer 315 converts the incoming serial data stream into a parallel data stream 470. Parallel data stream 470 is described in more detail in reference to FIG. 4. The parallel data stream is sent to signal processor 320. Signal processor 320 performs such functions as clock data recovery, generating different clocks for use by the FEC decoder 330 and the data processing element 340, and, optionally, calculating Bit Error Rate (BER). An important function of signal processor 320 is to find frame boundaries. Another important function of the signal processor 320 is to reconstruct a three-parallel frame 400 of input data. Three-parallel frame 400 is described in more detail in reference to FIG. 4. Briefly, the three-parallel frame 400 is created to allow and enhance the three-parallel processing performed by the FEC decoder 330 and data processing 340. Bus 325 is a bus that routes particular sections of the three-parallel frame 400 to particular inputs of the FEC decoder 330. This is described in more detail below.

The FEC decoder 330 is also described in additional detail below. Briefly, the FEC decoder 330 uses multiple three-parallel architectures and shared function blocks to quickly decode, in one embodiment, 48 symbols per clock cycle. The FEC decoder 330 has elements, to be described below, that reduce complexity and power. Output 335 of the FEC decoder is a parallel set of received and decoded data. Output 335 is output, in an embodiment of the present invention, as 48 bytes output in parallel, three bytes per input codeword. After decoding, the corrected data stream 335 is forwarded to block 340. In block 340, the overhead (see column 1, reference numeral 110 of FIG. 1) is processed. The overhead is protocol specific and contains system dependent information, like a frame alignment signal or network management, supervisory and control information. Optionally, information located in the payload area (columns 2 to 239 of FIG. 1) can be extracted and processed. Additionally, the data processing block 340 can perform other functions such as a BER calculation, if not already performed, or a decision to turn on or off the error decoding functions of the FEC decoder 330.

If the encoder and decoder module 303 is being used as a repeater, the decoded data is fed through channel 345 to data processing unit 360. Alternatively, completely different data can fed to data processing 360 as input data. Data processing block 360 can convert the format of the input data or decoded data into the parallel bit stream used by the FEC encoder 370. The data processing block 360 also adds any overhead information to the input data, if the overhead information has not already been added. Such information can include frame alignment signal and network management, supervisory and control information. Output 365 of the data processing block 360 is generally formatted so that every three bytes of the input data are directed to one three-parallel encoder of the FEC encoder 370. The FEC encoder 370 comprises a plurality of three-parallel encoders, which are shown in more detail below. The synchronizer and signal processor 380 creates appropriate clock signals for the serializer 390 and also packages the input data into a three-parallel frame 400. Serializer 390 converts the three-parallel frame 400 into a serial bit stream entitled "output data" in FIG. 3. This output data can then be transmitted by optical transmitting unit 395 or, optionally, by serializer 390. Optical transmitting unit 395 converts the serial bit stream of the output data to an optical representation of the bit stream. The optical transmitting unit 395 can comprise, for instance, a laser diode or light-emitting diode and modulation system.

Essentially, frame 400 and the encoder and decoder module 303 are designed to meet the ITU-T standards for an RS(255,239) code with the lowest complexity, power consumption, and cost for a 40 Gigabyte per second (Gb/s) transmission or reception rate. It should be noted that, while the client signal can operate at approximately 40 Gbit/s, the line signals (encoded output data or received encoded data to be decoded) will be higher. This is due to the added overhead bytes and redundancy bytes. For each codeword of an RS(255,239) code in module 303, only 238 bytes are data bytes. The other 17 bytes are overhead and redundancy bytes. The data rate for the client signals, consequently, must be increased by ((255/238)−1), or ((15/14)−1), or 7.143 percent. For a client signal operating at 40 Gb/s, this means that the data rate on an optical channel for the received or output data can be 42.86 Gb/s (for ITU-T G.975: 42.47 Gb/s; for ITU-T G.709: 43.015 Gb/s).

To operate at such high speeds yet with a relatively small amount of power, portions of the encoder and decoder module 303 use three-parallel processing, reduced complexity, and power saving modes.

Figure 4:
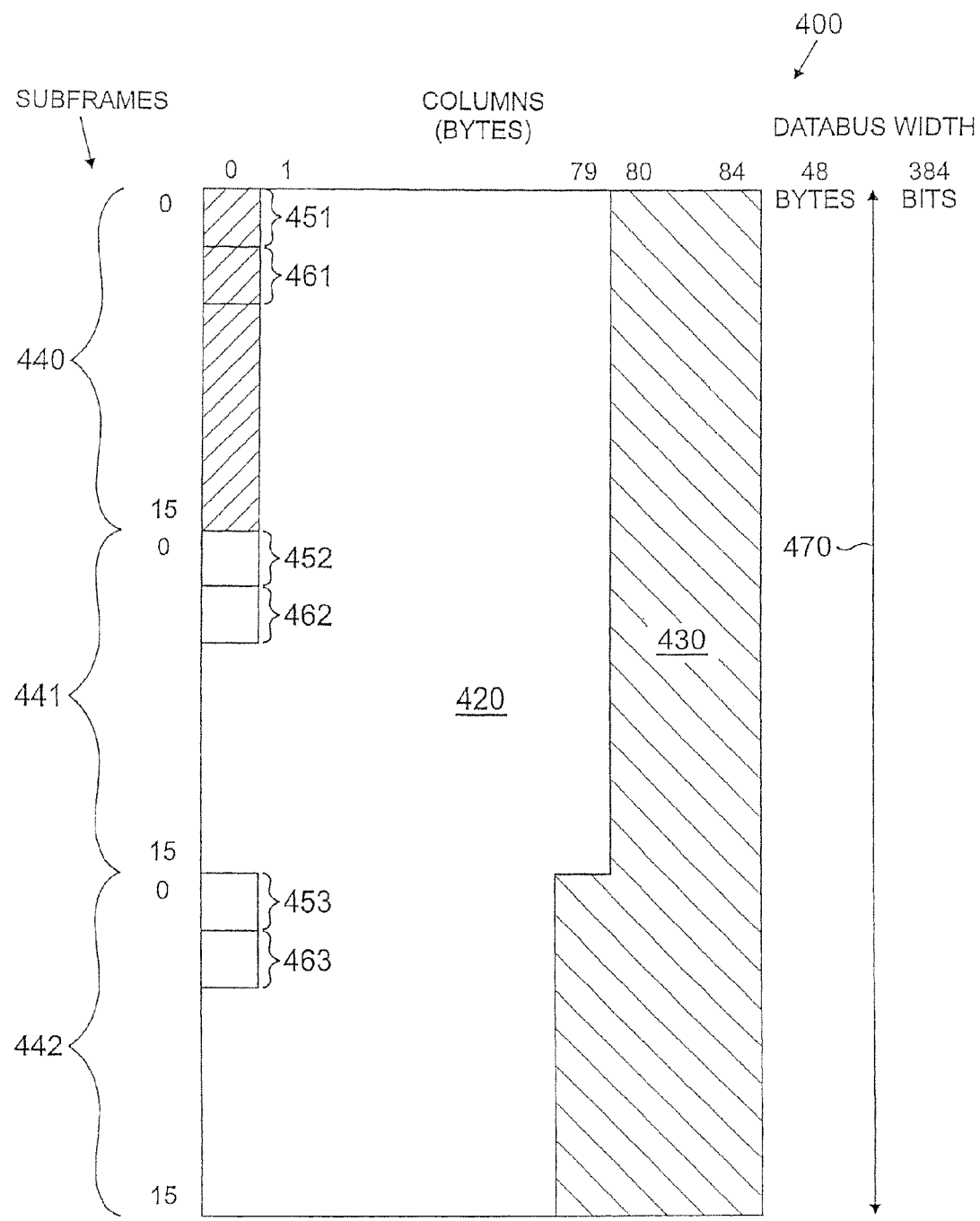
FIG. 4 is a block diagram of a frame, in accordance with a preferred embodiment of the invention.

Turning now to FIG. 4, a three-parallel frame 400 is shown. Three-parallel frame 400 is designed to meet the requirements of ITU-T standards G.975 and G.709, as described in reference to FIG. 1. The frame 400 comprises 85 columns. One column of the three-parallel frame 400 comprises three subframes 440, 441, 442. Each subframe 440, 441, 442 comprises 16 symbols. In this example, each symbol is a byte. The first 16 bytes (i.e., subframe 440 of column zero) of frame 400 comprise overhead information. The next 3808 bytes are payload 420. The payload 420 ranges from subframe 441 of column zero to subframe 441 of column 79. There are 256 bytes of parity 430, which ranges from subframe 442 of column 79 to subframe 442 of column 84. Frame 400 contains 4080 bytes.

Typically, network systems internally operate at approximately 83 Mhz. This results in 512 bits that have to be processed per clock cycle. In order to reduce bus width on the one hand and also reduce complexity, data is processed at a higher frequency. Current technology already enables complex operations at 166 MHz, which reduces the bus width by a factor of two (e.g., 512 bits/2=256 bits per clock cycle). Consequently, this means that 32 bytes or two columns would be processed per clock cycle. Due to the fact that the frame format comprises an odd number of columns (e.g., 255 columns) an additional mapping would have to be performed. In order to avoid this additional, redundant effort, it is recommended that another alternative be taken, i.e. 3 columns (=48 bytes) are to be processed per clock cycle. The resulting bus width is 384 bits and the frequency is 83 MHz multiplied by (512/384)=111 MHz.

The three-parallel frame 400 is designed so that the width of a data bus 470 adding data to the frame 400 or removing data from the frame 400 is 48 bytes wide, or 384 bits wide. It takes 85 clock cycles, at 111 MegaHertz (MHz), to fill one frame 400 with data. During each clock cycle, 48 bytes are received or transmitted. Three-parallel encoding and decoding allows the clock rate to be 111 MHz instead of 334 MHz.

Typically, network systems internally operate at approximately 83 Mhz. This results in 512 bits that have to be processed per clock cycle. In order to reduce bus width on the one hand and also reduce complexity, data is processed at a higher frequency. Current technology already enables complex operations at 166 MHz, which reduces the bus width by a factor of two (here, 512 bits/2 or 256 bits per clock cycle). Consequently, this means that 32 bytes or two columns would be processed per clock cycle. Due to the fact that the frame format comprises an odd number of columns (here, 255 columns), an additional mapping has to be performed. In order to avoid this additional, redundant effort, another alternative is taken, i.e., three columns (=48 bytes) are processed per clock cycle. The resulting bus width is 384 bits and the frequency is 83 MHz multiplied by (512/384), or 111 MHz.

To implement three-parallel processing, bytes of each column of three-parallel frame 400 are routed to each three-parallel decoder. Illustratively, bus 325 (see FIG. 3) is a hard-wired bus that performs this routing. References 451, 452, and 453 illustrate the locations for the first three bytes of a received codeword, where reference 451 illustrates the location of the first byte and reference 453 illustrates the location of the last byte. Each of these bytes is routed to one three-parallel syndrome generator, as described in more detail in reference to FIG. 10. Similarly, references 461, 462, and 463 illustrate the locations for the first three bytes of the second received codeword, where reference 461 illustrates the location of the first byte and reference 463 illustrates the location of the last byte. These bytes are routed to a second three-parallel syndrome generator, as described in more detail below in reference to FIG. 10.

It should be noted that three-parallel frame 400 shown in signal processor 320 (see FIG. 3) is not necessary, but is shown for explanatory purposes. The FEC decoder 330 can contain First-In, First-Out (FIFO) memories that store the incoming codewords and that are also used to correct errors in the incoming codewords. The appropriate bytes from the three-parallel frame 400 will be routed to corresponding FIFO memories.

Figure 5:
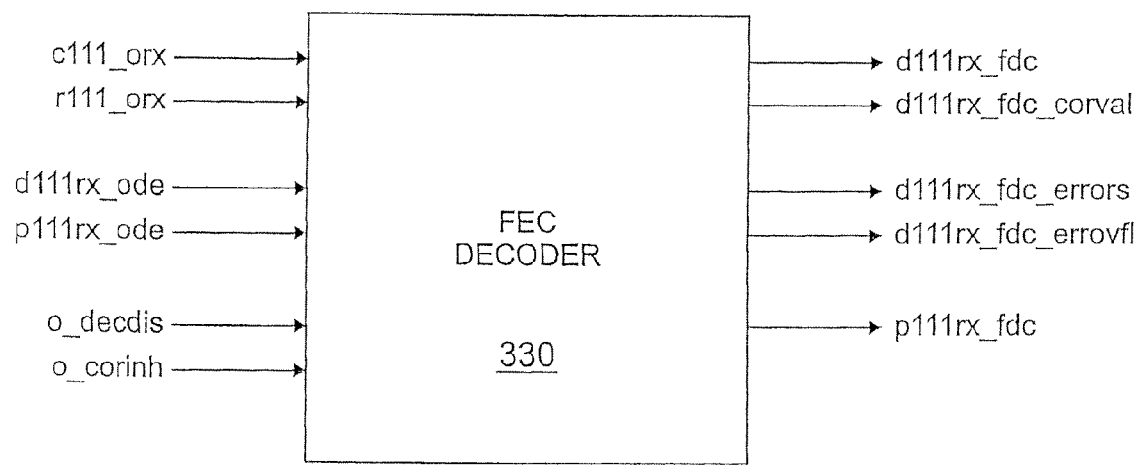
FIG. 5 is an exemplary illustration of an input/output interface for a Forward Error Correcting (FEC) decoder, in accordance with a preferred embodiment of the invention.

Turning now to FIG. 5, an input/output diagram for the FEC decoder 330 is shown. Inputs comprise the signals c111_orx, r111_orx, d111rx_ode, p111rx_ode, o_decdis, and o_corinh. The outputs comprise signals d111rx_fdc, d111rx_fdc_corval, d111rx_fdc_errors, d111rx_fdc_errovfl, and p111rx_fdc.

Descriptions of these signals are shown in FIG. 6. A few important signals will be presently described. The signal o_decdis is an input that enables or disables the FEC decoder 330. This allows a controller, such as signal processor 320 of FIG. 3, to disable or enable the decoder 330. The decoder could be disabled, for example, if the deployed FEC code is proprietary and cannot be processed by the FEC decoder.

Signal o_corinh is used to disable and enable error correction. Illustratively, this signal could be used to disable error correction if, during some previous time period, the error rate met a predetermined rate.

Figure 17:
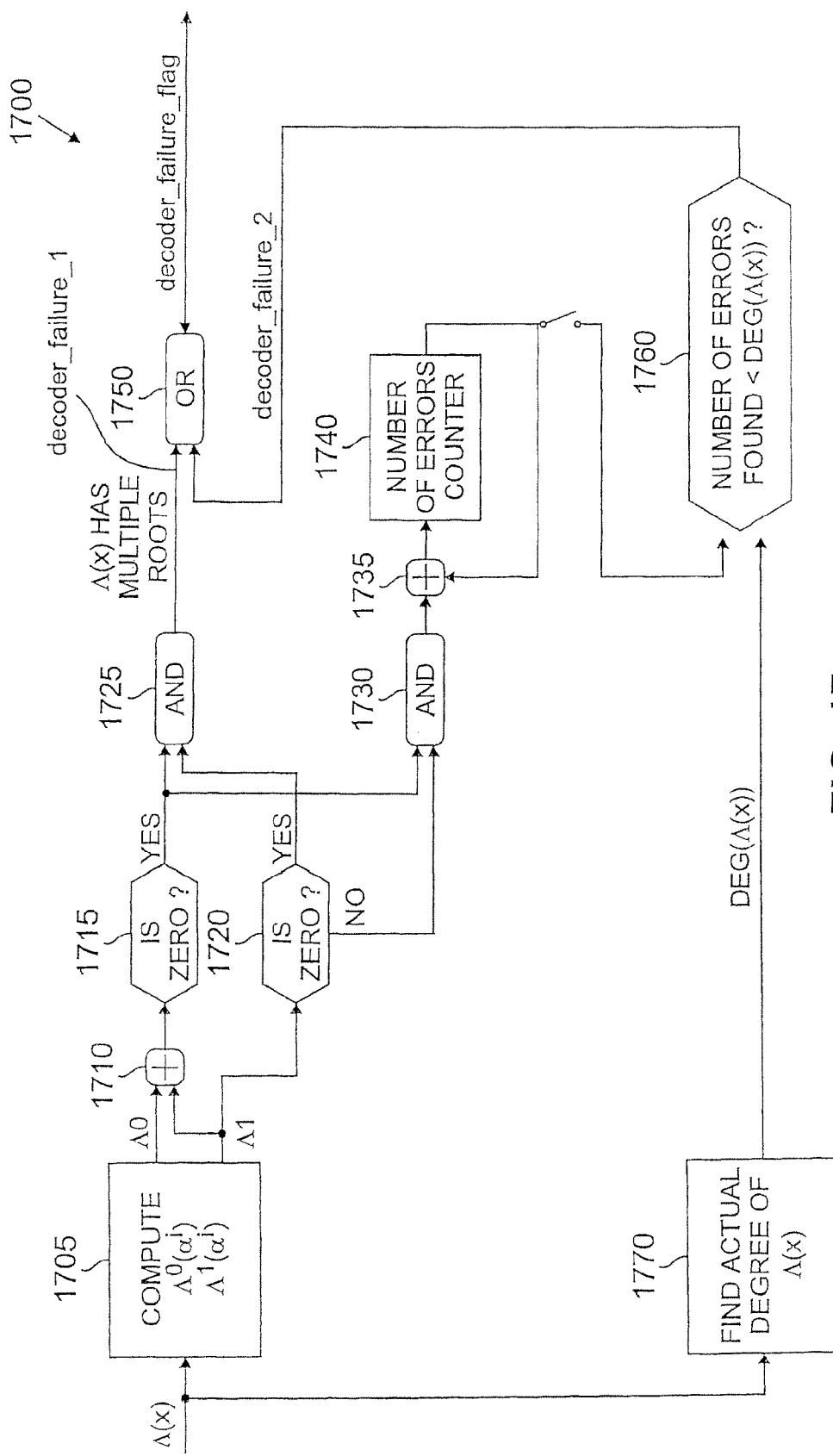
FIG. 17 is a low complexity circuit for determining when a decoder error has occurred, in accordance with a preferred embodiment of the invention.

The signal d111rx_fdc_corval is a signal indicating the bit position in the data stream (i.e., d111rx_fdc) where an error correction has occurred. This signal allows an external peripheral, such as data processing block 340 (see FIG. 3), to further process this information and generate optional control information. This signal is useful for determining if the errors are burst errors or random errors. and may be useful to diagnose problems with the channel or optical equipment. The signal d111rx_fdc_errors reports the number of corrected bit errors in a frame. The signal d111rx_fdc_errors can report 1024 possible errors. Each of the 16 blocks in one frame can correct eight symbol errors. Therefore, the total number of bit errors that can be corrected is 16 blocks multiplied by 8 symbol corrections/block multiplied by 8 bits/symbol, which is 1024 bits. The signal d111rx_fdc_errovfl reports the number of uncorrectable blocks within a frame. A device for determining whether a block is uncorrectable is shown in FIG. 17.

It should be noted that "std_ulogic" is Institute for Electrical and Electronics Engineers (IEEE) unresolved coding standard specific. Moreover, most components in encoder/decoder module 303 can be created through a VLSI Hardware Description Language (VHDL), where VLSI stands for Very Large Scale Integrated circuit.

Figure 7:
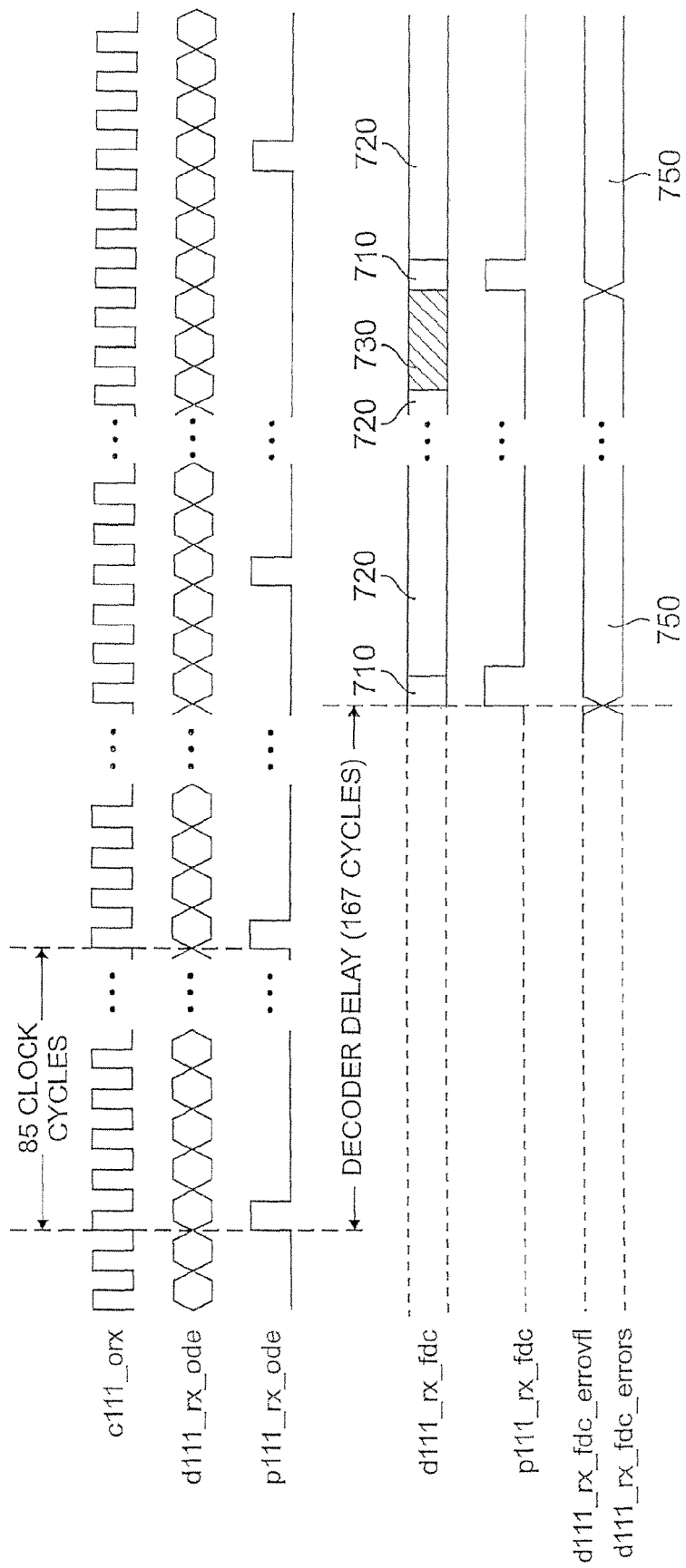
FIG. 7 is a timing diagram for the FEC decoder shown in FIG. 5, in accordance with a preferred embodiment of the invention.

Referring now to FIG. 7, a timing diagram for the inputs and outputs of FEC decoder 330 is shown. It takes 85 clock cycles to bring all of the bytes of one frame into the decoder. With each clock cycle, 48 bytes, or three subframes, are transferred to the decoder. It takes 167 clock cycles for the decoded information to begin leaving the decoder. The decoded information starts with a frame alignment word 710. Then the payload 720 is output. After this, there is a location for the parity check bytes 730. Outputting the parity check bytes 730 is not necessary. However, the parity check bytes 730 can be output because the FEC decoder can correct errors in a received word, including parity bytes, and the parity bytes are generally output. In location 750, error values for the previous frame are output.

Figure 8:
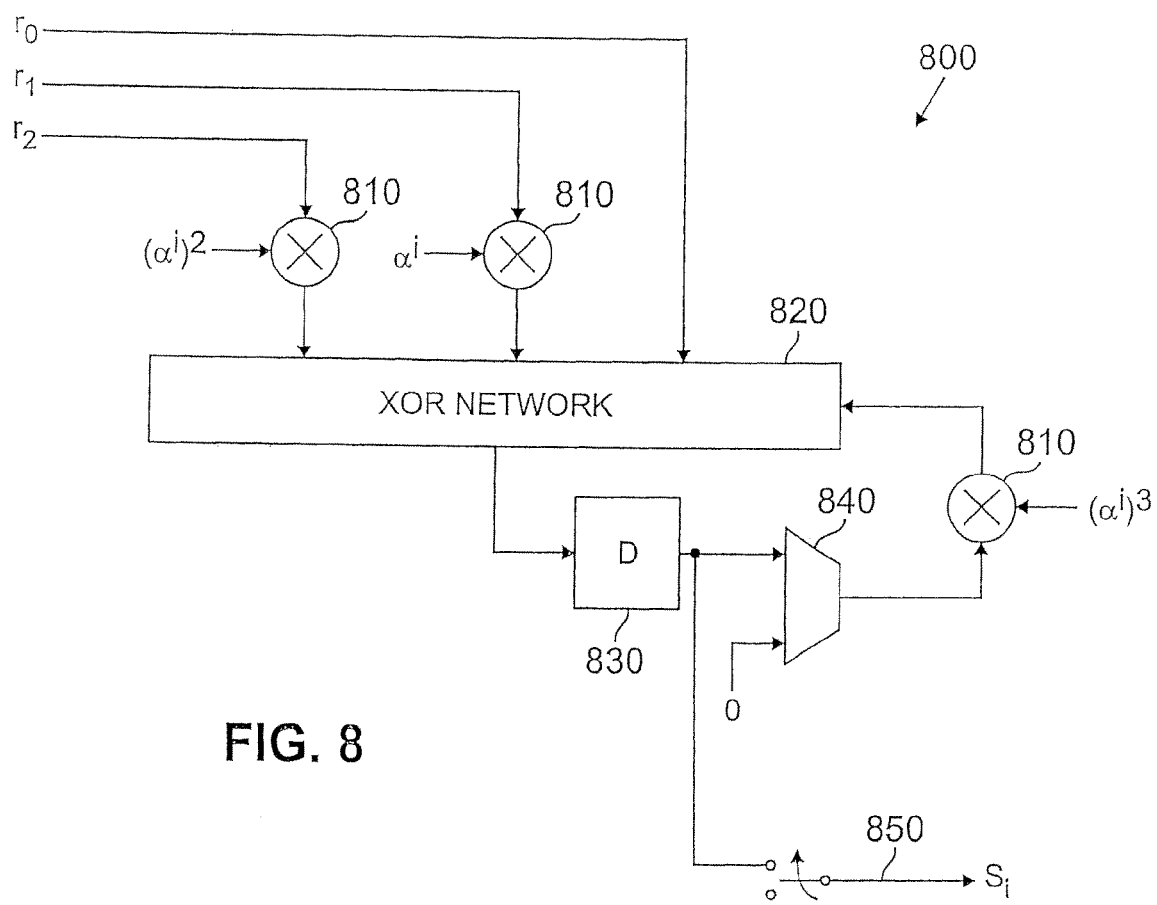
FIG. 8 is a block diagram of a three-parallel syndrome generator, in accordance with a preferred embodiment of the invention.

As described above, a parallel implementation of syndrome calculations may also be performed. An l-level parallel implementation processes l received symbols every clock cycle. This type of design speeds up the computation by l times at the expense of an l-fold increase in hardware complexity. For example, a three-parallel architecture for computing the syndrome $S_i$ is shown in FIG. 8, in accordance with a preferred embodiment of the invention. Syndrome generator 800 comprises three multipliers 810, an XOR (eXclusive OR) network 820, a delay 830, a multiplexer 840, and an output 850. Multiplexer 840 allows the syndrome generator 800 to be reset, which is performed every time a new block is to be processed. Output 850 is determined by sampling every n/3 clock cycles.

The syndrome generator 800 performs a syndrome calculation based on Horner's rule. The following example reflects the calculation that is performed in each syndrome generator 800:

$$S_1 = b(\alpha) = (\ldots (b_{254}\alpha + b_{253})\alpha + \ldots + b_1)\alpha + b_0, \quad (21)$$

$$S_2 = b(\alpha^2) = (\ldots (b_{254}\alpha^2 + b_{253})\alpha^2 + \ldots + b_1)\alpha^2 + b_0, \quad (22)$$

where $$b(x) = b_{254}x^{254} + b_{253}x^{253} + \ldots + b_1 x + b_0 \quad (23)$$

and $b_{254}, b_{253}, \ldots, b_1, b_0$ are the received symbols (bytes in this example) in one codeword.

Benefits of the three-parallel syndrome calculation of FIG. 8 include a reduction in clock speed and a reduction in control complexity with only a limited increase in complexity. Thus, the syndrome generator 800 allows high speed, parallel processing of syndromes with a minimal amount of complexity.

Figure 9:
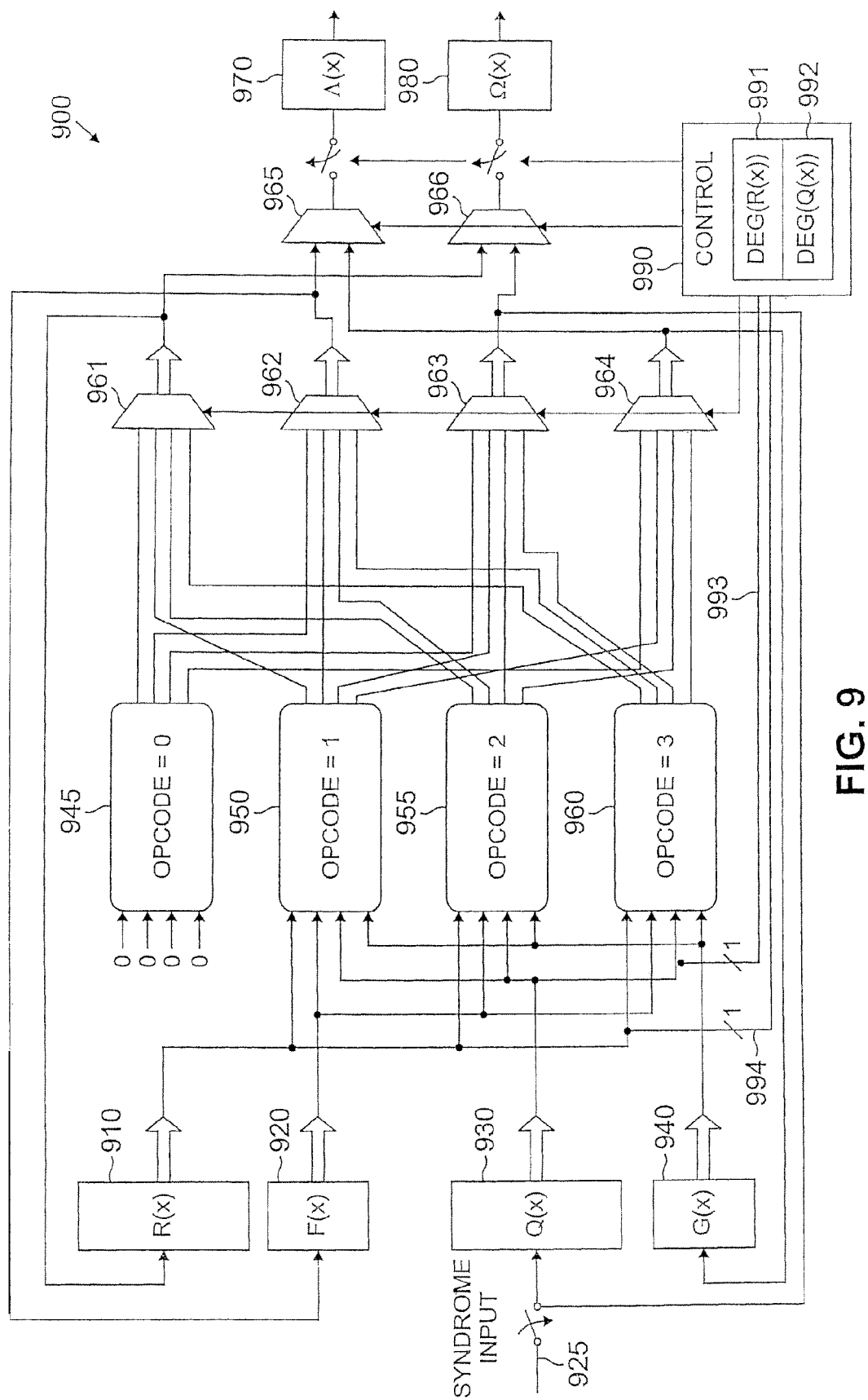
FIG. 9 is a block diagram of a modified Euclidean algorithm circuit in accordance with a preferred embodiment of the invention.

FIG. 9 illustrates a modified Euclidean algorithm circuit 900 that contains both power consumption reduction and complexity reduction aspects. Circuit 900 comprises an R(x) register 910, an F(x) register 920, a syndrome input 925, a Q(x) register 930, a G(x) register 940, opcodes 945, 950, 955, and 960, multiplexers 961, 962, 963, 964, 965, and 966, Λ(x) output 970, Ω(x) output 980, a control circuit 990, and lines 994, 993 that correspond to $R_{msb}$ and $Q_{msb}$, respectively. Control circuit 990 comprises two registers, deg(R(x)) 991 and deg(Q(x)) 992. Syndrome input 925 periodically latches data into Q(x) register 930 based on a command from control block 990. Control block 990 also controls multiplexers 961 through 966 and latching of output data to Λ(x) output 970 and Ω(x) output 980.

In circuit 900, each iteration carries out one of the following operations:

Opcode=3 (opcode 960 is selected): In this case, both $R_{msb}$ 994 and $Q_{msb}$ 993, the leading coefficients of the R(x) and Q(x) polynomials, are nonzero; and the cross multiplications shown in Equation (15) are carried out to update the four intermediate polynomials.

Opcode=2 (opcode 955 is selected): In this case, $R_{msb}$ 994 equals zero; the variable deg(R(x)), the degree of R(x), is reduced by one. All other intermediate variables remain unchanged.

Opcode=1 (opcode 950 is selected): In this case, $Q_{msb}$ 993 equals zero; only the variable deg(Q(x)), the degree of Q(x), is reduced by one.

Opcode=0 (opcode 945 is selected): This puts the entire block into low power mode by feeding zeros to all the intermediate variables. It is activated upon detection of completion of the key equation solving process, i.e., when either deg(R(x))<t or deg(Q(x))<t is satisfied. The deg(R(x)) 991 and deg(Q(x)) 992 registers are used to determine whether these conditions are met. It should be noted that the register deg(R(x)) 991 may be stored in register R(x) 910 and communicated to control circuit 990. Likewise, register deg(Q(x)) 992 may be stored in register Q(x) 930 and communicated to control circuit 990.

Actual computations are carried out only in "Opcode 3" mode 960, which requires (6t+2) Galois field multipliers. The loop critical path is lower bounded by one multiply-and-add time. Compared with a serial implementation of a modified Euclidean algorithm, there are multiple advantages of the architecture shown in FIG. 9. First, it processes all syndromes in parallel, and generates all coefficients of the error polynomials in parallel. This interfaces well with the syndrome generator and with the Chien's search block, as shown below in more detail. This also eliminates the need for a parallel-to-serial converter and a serial-to-parallel converter, as required in a serial conventional folded implementation. Such a conventional implementation is shown in Song 3, which has been incorporated by reference above. Second, when the number of errors that actually occur is smaller than t, i.e., the maximum number of symbol errors that an RS(n, n−2t) code can correct, the Euclidean algorithm converges within less than 2t iterations. A small control circuit 990 is used to detect early convergence of the algorithm (i.e., when either deg(R(x))<t or deg(Q(x))<t is satisfied), download the resulting polynomials, and put the entire block into low power "Opcode=0"

mode 945. Under normal operating conditions, the actual number of errors in each block is usually much smaller than t. Consequently, the additional "Opcode=0" mode 945 leads to great power savings.

It should be noted that control circuit 990 operates in parallel with opcodes 945 through 960. As described above, opcodes 945 through 960 operate in parallel with each clock cycle. During this operation, control circuit 990 selects which result of which opcode 945 through 960 is selected by multiplexers 961 through 964 for output by these multiplexers. For example, if both $R_{msb}$ 994 and $Q_{msb}$ 993 are not zero, multiplexers 961 through 964 are adjusted by control circuit 990 to output the result of opcode 960. As another example, if $R_{msb}$=0, then multiplexers 961 through 964 are adjusted by control circuit 990 to output the result of opcode 955. The conditions under which the results of opcodes 945 and 950 will be selected by control circuit 990 are described above. A benefit of this architecture is that it is faster than a serial implementation. For example, control circuit 990 could examine $R_{msb}$ 994 and $Q_{msb}$ 993 prior to enabling one of the opcodes 945 through 960. However, this type of serial operation will likely not meet timing requirements, as the critical path through circuit 900 will be increased in length and delay.

Additionally, the implementation shown in FIG. 9 also yields complexity benefits because register blocks 920 and 940 are no larger than that necessary to work with their values. The F(x) and G(x) registers will have a complexity on the order of at most t, whereas a conventional serial implementation has a complexity of about 2t, even though F(x) and G(x) will be at most as large as t. Further complexity benefits are realized by selecting low complexity multipliers and dividers. Selection of these devices and the devices themselves are described in more detail below. Lastly, it should be noted that implementation of the "Opcode 3" mode 960 by (6t+2) Galois field multipliers instead of by division results in a speed increase.

It should be noted that control circuit 990 could also gate clocks going to any circuitry in circuit 900. For instance, there could be flip-flops that switch with each clock cycle. Even though the input, in low power mode, to the flip-flop will be zero, there will be some extra power because of the switching flip flops. This power can be reduced by gating the clocks, as is known in the art.

Figure 10:
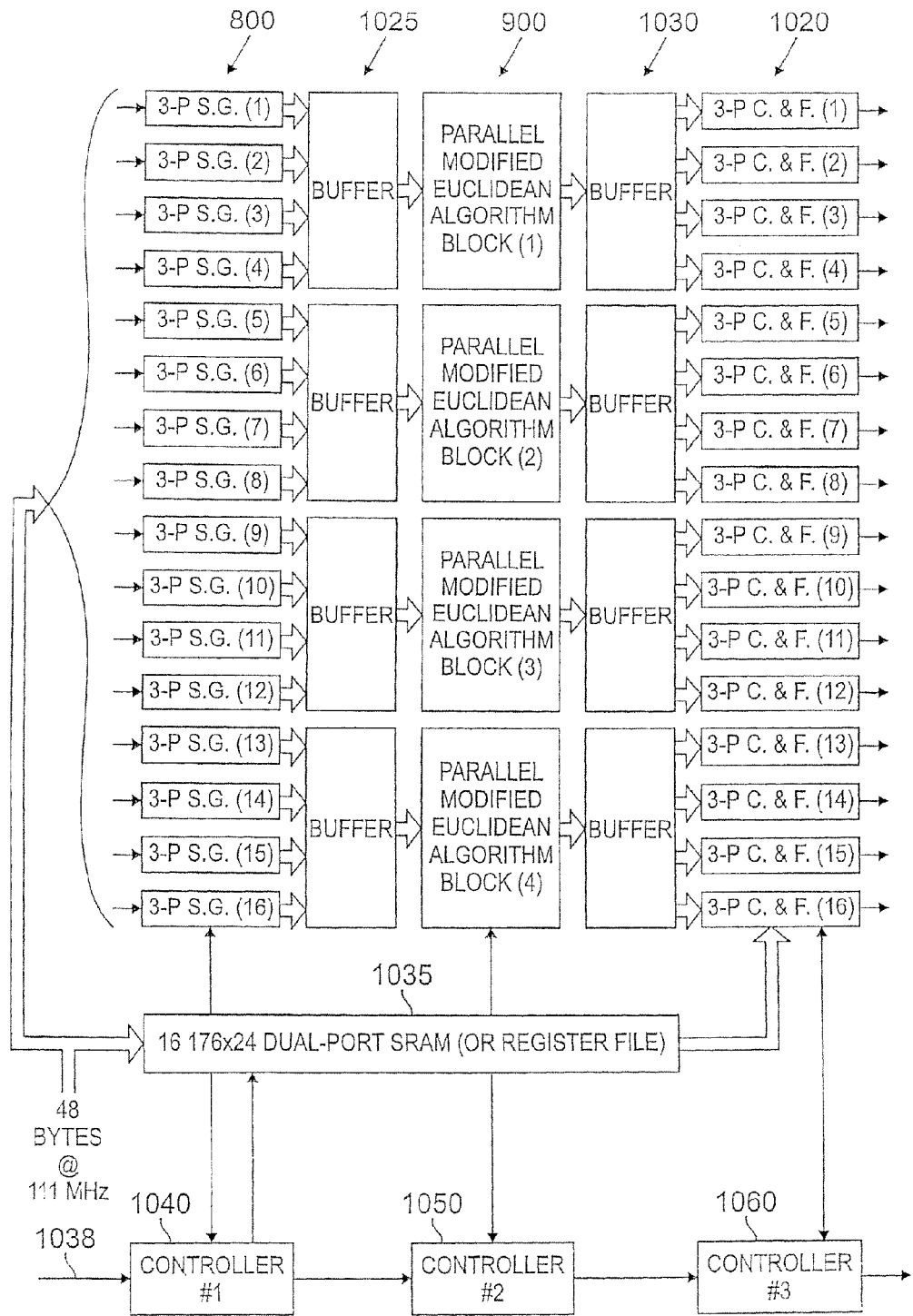
FIG. 10 is a block diagram of an FEC decoder in accordance with a preferred embodiment of the invention.

The block diagram of a 16-way interleaved RS decoder 1000 is shown in FIG. 10. The decoder comprises sixteen three-parallel syndrome generators 800, four key equation solver blocks 900, and sixteen three-parallel Chien's search and Forney's algorithm blocks 1020 for calculating error locations and error values. Additionally, RS decoder 1000 comprises four syndrome buffers 1025, four error polynomial buffers 1030, a block 1035 of preferable 16 dual-port Static Random Access Memories (SRAMs), each of size 176 by 24, start-of-frame input pulse signal 1038, and three controllers 1040, 1050, and 1060.

The start of a new frame is indicated by the start-of-frame input pulse signal 1038. Each three-parallel syndrome generator 800 completes syndrome calculations in 85 cycles and produces 16 syndromes every 85 cycles. Each set of 16 syndromes is generated from one block of 255 symbols. Each three-parallel syndrome generator 800 determines syndromes for three bytes of one codeword. For instance, referring briefly to FIG. 4 in addition to FIG. 10, bytes indicated by reference numerals 451, 452, and 453 are routed to three-parallel syndrome generator (1) 800, which performs syndrome calculations in one cycle for these bytes. Similarly, bytes indicated by reference numerals 461, 462, and 463 are routed to three-parallel syndrome generator (1) 800, which performs syndrome calculations in one cycle for these bytes.

Returning exclusively to FIG. 10, each syndrome buffer 1025 holds 64 syndromes, wherein each set of 16 syndromes in the 64 syndromes is from one three-parallel syndrome generator 1010. Each syndrome buffer 1025 will then pass one set of 16 syndromes in parallel to one of the key equation solver blocks 900. This occurs every 18 cycles. With the folded parallel implementation shown in FIG. 9, the error locator and error evaluator polynomials for each received block can be found in 16 clock cycles. This indicates that one key equation solver block 900 can be shared among four syndrome generators 800, because each key equation solver block 900 takes 16 cycles to complete while the syndrome generators 800 take 85 cycles to complete. Having one solver block 900 shared by four syndrome generators 800 substantially reduces the overall hardware complexity since the key equation solver block 900 is the most complicated part in RS decoder 1000.

Upon completion of calculating the error locator and error evaluator polynomials for all 16 blocks, these error polynomials are downloaded in parallel into the error polynomials buffers 1030. The error polynomials are collected until all four syndromes have been passed through a key equation solver block 900, and then the error polynomials are downloaded in parallel to the three-parallel Chien's search and Forney's algorithm blocks 1020, where the error locations and error values are found and error corrections are carried out. Song 3 describes the structure of three-parallel Chien's search and Forney's algorithm blocks 1020. A block 1035 of preferable sixteen dual-port SRAMs of size 176 by 24 is required to buffer the received data for error correction.

The three-parallel system of the present invention, including the three-parallel Chien's search and Forney's algorithm blocks 1020, is used for at least the following reasons.

(1) The input and output format of the decoder should be the same, i.e., if the decoder takes 48 bytes of input symbol per cycle, it should also produces 48 bytes of decoded symbol per cycle. Thus, both encoder and decoder modules are consistent.

(2) A reason for using 3-parallel processing is to avoid use of faster clock (about 335 MHz instead of about 112 MHz) which is expensive, less reliable and difficult to implement with current technology.

(3) The syndrome generators need to process all 255 symbols in one block to compute the syndromes. If three input symbols are processed per cycle, syndrome generation requires 85 cycle to complete. This calculation has nothing to do with how many syndromes are generated. For example, if the system uses an RS(255, 249) code instead, six syndromes need to be generated. To achieve 40 Gbits/s throughput rate with a clock rate of 112 MHz, a three-parallel syndrome generator that processes three bytes of incoming data per code block is needed for each of the 16 component code block.

(4) In the Chien's search block, the error locator and error evaluator polynomials need to be evaluated at 255 possible symbol locations in order to decide which of them have errors. A serial Chien's search circuit would require 255 cycle to complete the Chien's search, which is too much of a delay.

(5) If an on-the-fly error correction is performed in the Chien's search block, i.e., correct the stored 48-byte input symbols per cycle while searching for the error locations, then each Chien's search block should be able to search for three symbol locations per cycle, and output three decoded symbols per cycle. This can be done using either one serial Chien's search and Forney's algorithm (see circuits 500 and 600 of FIGS. 5 and 6 in Song 3) running at 3 times faster clock, or using a three-parallel Chien's search and Forney's algorithm 1020 (see the description in Song 3 of appropriate three-parallel Chien's search and Forney's algorithm 500), which process three symbol locations per cycle. The reason for using a three parallel Chien's search and Forney's algorithm 1020 is the same as that for the syndrome generator block, which is to avoid using a faster clock.

(6) If the error location and error values are computed and stored first, and the error correction is performed later on, potentially one could use a single Chien's search and Forney's algorithm circuit and compute one symbol location per cycle. However, this increases the decoder latency by at least (255−85=170) cycles. This essentially doubles the decoder latency as the Chien's search for next block can only start after the current block being processed. This also doubles the size of the SRAM memory that stores the incoming data block, as the size of the SRAM memory is proportional to decoder latency. In summary, to avoid the use of faster clock, to avoid increasing decoder latency, to avoid enlarging memory requirements. to maintain the same input/output data bus format (48 Bytes/cycle), a three-parallel version of the Chien's search and Forney's algorithm are used.

As the functional blocks of an RS decoder may be logically divided into three sub-blocks according to the three decoding steps, three control circuits 1040, 1050, 1060 are implemented in RS decoder 1000, one for each decoding step. The controller 1040 for the syndrome generator blocks 1010 is triggered by the start-of-frame input pulse signal 1038, and is responsible for calculating the write address for the SRAMs 1035 as well as generating a pulse to trigger the key equation solver block 900 to download the new syndromes and start computation. The second controller 1050, triggered by a pulse signal from the first controller 1040, is responsible for controlling the time-multiplexing of one key equation solver block 900 among four syndrome generators 800, and signaling the Chien's search and Forney's algorithm blocks 1020 to start computation when the error polynomials are available. The second controller 1050 also communicates with control block 990, shown in FIG. 9, to place the key equation solver block 900 into low power mode. The third control block 1060 is triggered by a pulse signal from the second controller 1050 and is responsible for generating control signals for the error correction blocks 1020. Note that the individual controllers can be combined to a single controller. Any combination is possible.

A test is implemented to determine if a group of syndromes are all zeros (i.e., there are no errors in the received block of data). Such testing may be implemented as illustrated in FIG. 2 and, in particular, block 220. If all of the syndromes for one of the three-parallel syndrome generators 800 are zero, then the rest of the decoder, for this group of syndromes is put into or maintained in low power mode. For instance, if the syndromes for three-parallel syndrome generator (1) 1010 are zero, then the Euclidean algorithm block 900 corresponding to this syndrome generator does not run for this set of syndromes. The Euclidean algorithm block 900 corresponding to three-parallel syndrome generator (1) 1010 will remain in low power mode. If, however, one or more of the syndromes from three-parallel syndrome generator (2) 1010 are not zero, then the Euclidean algorithm block 900 corresponding to this syndrome generator will run. Note that, because the same Euclidean algorithm block 900 is shared amongst three-parallel syndrome generator (1) 1010 through three-parallel syndrome generator (4) 1010, the Euclidean algorithm block 900 is time-multiplexed amongst the four syndrome generators 800.

There are a variety of locations to test for zero syndromes. For instance, each syndrome buffer 1025 could implement a test to determine if all syndromes for one of the syndrome generators 800 are zero. Additionally, tests may be made by circuitry (not shown) separate from syndrome generators 1020 and syndrome buffers 1025.

For an input Bit Error Rate (BER) of around $10^{-4}$, an error occurs only 20% of the time. For an input BER of around $10^{-5}$, only the syndrome generator needs to be active most of the time. The three-step, domino-type control circuitry mimics the effect of clock gating and allows the decoder to take advantage of this to save power. With three controllers, the RS decoder 1000 has multiple locations at which it can control aspects of the decoder 1000 to save power.

It should be noted that, if all syndromes for a received block are zero, controller 1050 will never start the modified Euclidean algorithm block 900 for this data block. This prevents the modified Euclidean algorithm block 900 from iterating several times and then going into low power mode, and this saves additional power. The iterations would occur because portions of the modified Euclidean algorithm block 900 would not be initialized to zero upon startup. Thus, even though a syndrome is zero, the modified Euclidean algorithm block 900 may iterate a few times until the control block 990 (see FIG. 9) associated with the modified Euclidean algorithm block 900 will place the block 900 into low power mode.

Note that clock gating may also be used by controllers 1040, 1050, and 1060. This will further reduce power.

Galois Field Arithmetic and Selection of Multipliers and Dividers

As is known in the art, there are a variety of different types of Galois field multipliers and dividers. However, not all of these multipliers and dividers are suitable for building low power and high speed RS encoders and decoders. The basic building blocks in RS encoders and decoders include Galois field adders, multipliers and dividers. The present section describes basic Galois field arithmetic and then discusses different multipliers and dividers and reasons for choosing particular multipliers or dividers.

Galois Field Arithmetic

A field is a set of elements that are self-contained under addition and multiplication. Two other operations, subtraction and division, are implied by the existence of inverse elements under addition and multiplication. A field with finite number of elements is called a finite field or Galois field. A Galois field with q elements is denoted as GF(q) and it only exists when q is a power of a prime number. Every Galois field has a primitive element a, which has the property that the q−1 powers of α are the q−1 nonzero elements of the field. An important property of GF(q) is that $\forall \ \beta \in GF(q), \beta^{q-1}=1$.

The finite field $GF(2^m)$ contains $2^m$ elements. It is an extension field from GF(2) and can be viewed as an m-dimensional vector space over GF(2). This section introduces two bases for representing the elements in $GF(2^8)$, the standard basis and the composite basis, and multiplier and divider design using these 2 representations.

The finite field $GF(2^8)$ can be considered as an extension field over GF(2), where all its elements are represented as polynomials over GF(2) of degree less than or equal to seven as follows:

$$GF(2^8)=\{A|A=a_7x^7+a_6x^6+\ldots+a_1x+a_0, a_i \in GF(2)\}. \quad (24)$$

This is called the "standard basis representation." On the other hand, $GF(2^8)$ can also be considered as $GF((2^4)^2)$, composition of two-level extension, as follows:

$$GF(2^8)=GF((2^4)^2)=\{A|A=A_1y+A_0, A_i \in GF(2^m) \text{ and } A_i=a_{i3}z^3+a_{i2}z^2+a_{i1}z^1+a_{i0}, a_{ij} \in GF(2)\}. \quad (25)$$

This is referred to as the "composite representation."

Let $p(x)=x^8+x^4+x^2+1$ be the primitive polynomial used for the computation in $GF(2^8)$, and let a, the primitive element in $GF(2^8)$, be the root of $p(x)$. Then $\{\alpha^7, \ldots, \alpha^2, \alpha, 1\}$ is the standard basis for the eight-dimensional vector space $GF(2^8)$, and any element A in $GF(2^8)$ can be represented by its coefficient vector as $$A=[a_7 a_6 a_5 a_4 a_3 a_2 a_1 a_0], \quad (26)$$

where $a_i \in GF(2)$.

Let $\omega$ be the root of the primitive polynomial $p4(z)=z^4+z+1$. Then, $q2(y)=y^2+y+\omega^{14}$ is a primitive polynomial over $GF(2^4)$ and can be used for the computation in $GF((2^4)^2)$. Let $\beta$ be a root of $q2(y)$. In this case, the basis vector is $\{\beta\omega^3, \beta\omega^2, \beta\omega, \beta, \omega^3, \omega^2, \omega, 1\}$, and any element $A_c$ in $GF((2^4)^2)$ is represented by the following coefficient vector:

$$A_c=[A_1 A_0]=[a_{13} a_{12} a_{11} a_{10} a_{03} a_{02} a_{01} a_{00}], \quad (27)$$

where $A_1$ and $A_0$ are elements of $GF(2^4)$ and $a_{ij}$ are elements of $GF(2)$.

The addition operation in either representation involves only bit-wise modulo-two addition over $GF(2)$, and can be carried out using XOR operations. This section presents schemes for multiplication and division operations. The algorithm and complexity of a standard-basis Mastrovito multiplier, a composite-basis multiplier and a composite-basis divider are presented here. A standard-basis Mastrovito multiplier is described in Mastrovito, "VLSI designs for multiplication over finite fields $GF(2^m)$," Int'l Conf. on Applied Algebra, Algebraic Algorithms, and Error-Correcting Codes, 297-309, Rome, July 1988, the disclosure of which is incorporated herein by reference. A composite-basis multiplier and a composite-basis divider are described in Paar, "Efficient VLSI Architectures for Bit-Parallel Computation in Galois fields," Ph.D. Thesis, Institution for Experimental Mathematics, Univ. of Essen, Germany, June 1994, the disclosure of which is incorporated herein by reference. With the mixed use of these two bases representations in RS decoding, conversion circuitry between these two bases is required. The basis conversion matrix between A in Equation (26) and $A_c$ in Equation (27) is as follows:

$$T_{std\_to\_comp}=\begin{bmatrix} 0 & 0 & 1 & 0 & 0 & 0 & 0 & 0 \\ 0 & 1 & 1 & 0 & 0 & 1 & 0 & 0 \\ 0 & 0 & 0 & 1 & 1 & 0 & 1 & 0 \\ 1 & 0 & 0 & 1 & 0 & 0 & 0 & 0 \\ 0 & 0 & 1 & 0 & 0 & 1 & 1 & 0 \\ 1 & 0 & 0 & 1 & 1 & 0 & 1 & 0 \\ 0 & 0 & 1 & 0 & 0 & 0 & 1 & 0 \\ 0 & 0 & 0 & 0 & 1 & 0 & 1 & 1 \end{bmatrix}, \quad (28)$$

$$T_{comp\_to\_std}=\begin{bmatrix} 0 & 0 & 1 & 0 & 0 & 1 & 0 & 0 \\ 1 & 1 & 0 & 0 & 1 & 0 & 1 & 0 \\ 1 & 0 & 0 & 0 & 0 & 0 & 0 & 0 \\ 0 & 0 & 1 & 1 & 0 & 1 & 0 & 0 \\ 1 & 0 & 0 & 1 & 0 & 1 & 1 & 0 \\ 0 & 0 & 0 & 0 & 1 & 0 & 1 & 0 \\ 1 & 0 & 0 & 0 & 0 & 0 & 1 & 0 \\ 0 & 0 & 0 & 1 & 0 & 1 & 0 & 1 \end{bmatrix}.$$

Both conversions require nine XOR gates and have a computation time of two XOR gate delays.

Mastrovito Standard-Basis Multiplier

Using the standard basis representation and the primitive polynomial $p(x)=x^8+x^4+x^3+x^2+1$, the multiplication $W=A \times B$, where A, B, W $\in GF(2^8)$, can be computed in two steps as follows.

Figure 11:
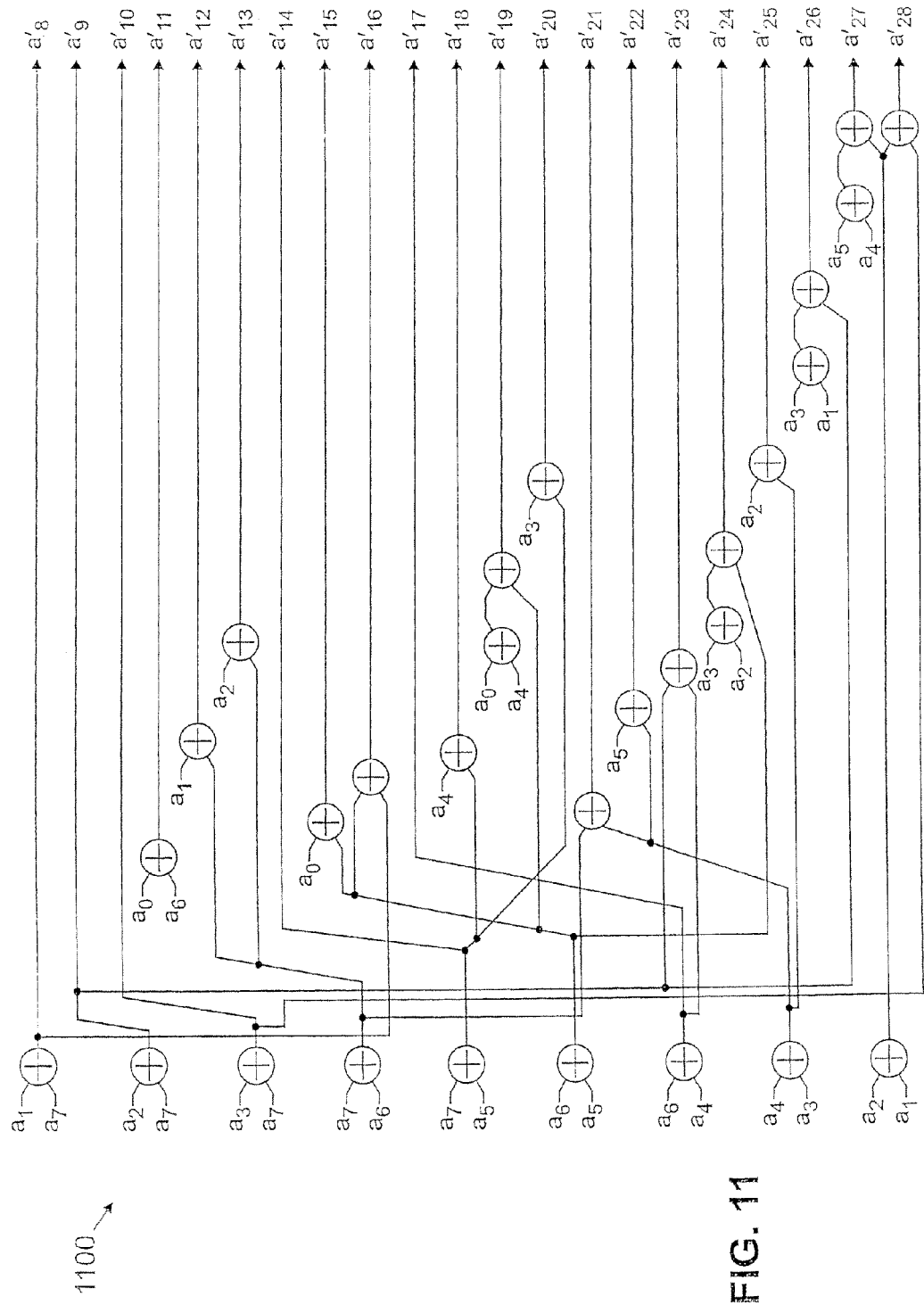
FIGS. 11 and 12 are diagrams of low complexity circuits used when performing a Mastrovito standard-basis multiplication, in accordance with a preferred embodiment of the invention.

First, perform the following computations:

$$a'_8=a_1+a_7, a'_9=a_2+a_7, a'_{10}=a_3+a_7, a'_{11}=a_0+a_6,$$
$$a'_{12}=a_1+a_7+a_6, a'_{13}=a_2+a_7+a_6, a'_{14}=a_7+a_5,$$
$$a'_{15}=a_0+a_6+a_5, a'_{16}=a_1+a_7+a_6+a_5, a'_{17}=a_6+a_4,$$
$$a'_{18}=a_7+a_5+a_4, a'_{19}=a_0+a_6+a_5+a_4, a'_{20}=a_5+a_3+a_7, a'_{21}=a_6+a_4+a_3+a_7, a'_{22}=a_5+a_4+a_3, a'_{23}=a_4+a_2+a_7+a_6, a'_{24}=a_5+a_3+a_2+a_6, a'_{25}=a_4+a_3+a_2,$$
$$a'_{26}=a_3+a_1+a_6+a_5, a'_{27}=a_4 a+a_2+a_1 a_5, a'_{28}=a_3+a_2+a_1+a_7, \quad (29)$$

where each "+" denotes an XOR operation. A circuit 1100 that performs the functions of Equation (29) is shown in FIG. 11.

Then, the eight product bits can be computed by carrying out the following eight inner products in $(GF(2))$ through the following:

$$\begin{bmatrix} w_7 \\ w_6 \\ w_5 \\ w_4 \\ w_3 \\ w_2 \\ w_1 \\ w_0 \end{bmatrix} = \begin{bmatrix} a_7 & a_6 & a_5 & a_4 & a'_{10} & a'_{13} & a'_{16} & a'_{19} \\ a_6 & a_5 & a_4 & a'_{10} & a'_{13} & a'_{16} & a'_{19} & a'_{22} \\ a_5 & a_4 & a'_{10} & a'_{13} & a'_{16} & a'_{19} & a'_{22} & a'_{25} \\ a_4 & a'_{10} & a'_{13} & a'_{16} & a'_{19} & a'_{22} & a'_{25} & a'_{28} \\ a_3 & a'_9 & a'_{12} & a'_{15} & a'_{18} & a'_{21} & a'_{24} & a'_{27} \\ a_2 & a'_8 & a'_{11} & a'_{14} & a'_{17} & a'_{20} & a'_{23} & a'_{26} \\ a_1 & a_0 & a_7 & a_6 & a_5 & a_4 & a'_{10} & a'_{13} \\ a_0 & a_7 & a_6 & a_5 & a_4 & a'_{10} & a'_{13} & a'_{16} \end{bmatrix}. \quad (30)$$

Figure 12:
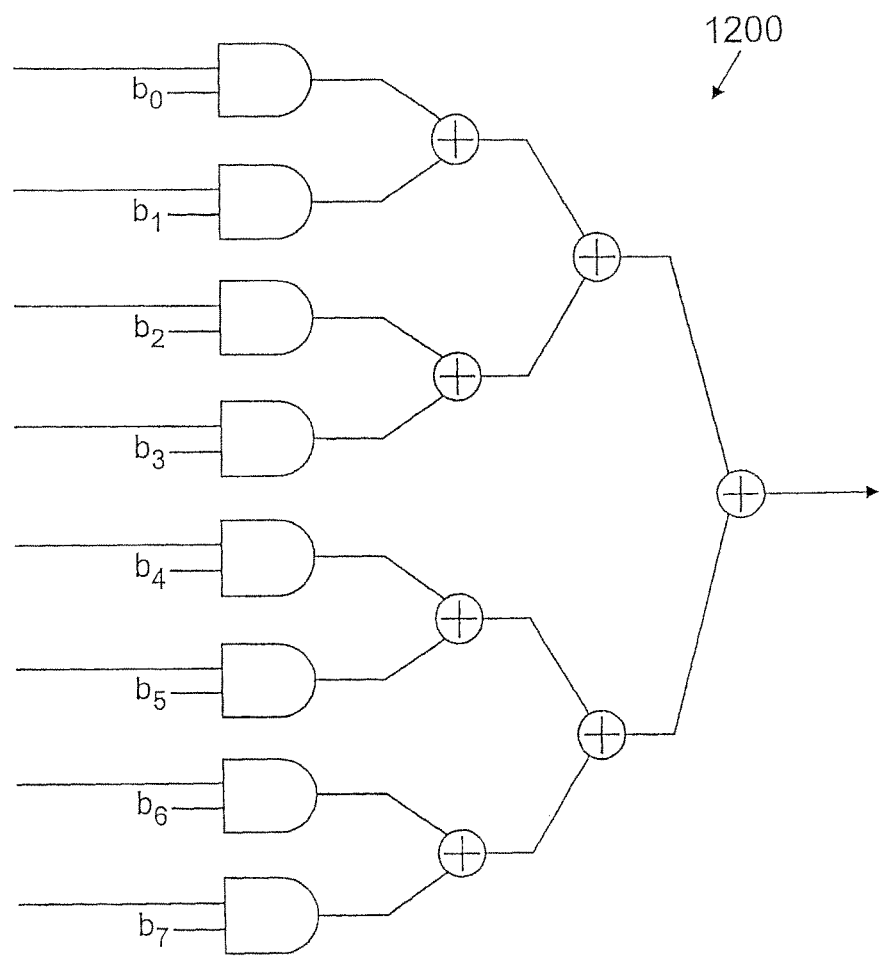

A low complexity circuit 1200 for determining one row of the matrix in Equation (30) is shown in FIG. 12. This circuit 1200 will compute the $w_{8-i}$, $i=1, 2, \ldots, 8$. Each multiplier requires one circuit 1100 and eight circuits 1200.

This standard basis variable-input multiplier requires 64 AND gates and 85 XOR gates, and has a computation delay of (one DAND+five DXOR), where DAND and DXOR denote one AND and XOR gate delay, respectively.

A benefit of this multiplier is that it does not require basis conversion. Consequently, this multiplier is less complex and yet has the same amount of delay as the next multiplier.

Composite-Basis Multiplier

Now consider multiplication in the composite field $GF((2^4)^2)$. Suppose that A, B and W are all in composite representation. Then the multiplication $W=A \times B$ can be computed as follows:

$$W_1=(A_0+A_1)*(B_0+B_1)+A_0*B_0, W_0=A_0*B_0+A_1*B_1*\omega^{14}, \quad (31)$$

where "*" and "+" are multiplication and addition in $GF(2^4)$, respectively. This composite multiplication can be carried out using four additions, three variable multiplications and one constant multiplication in GF($2^4$). Multiplication in GF($2^4$), i.e. $A_0*B_0$ (where $A_0=a_{03}z^3+a_{02}z^2+a_{01}z+a_0$ and $B_0=b_{03}z^3+b_{02}z^2+b_{01}z+b_0$), can be carried out by computing the following matrix-vector product in GF(2):

$$\begin{bmatrix} a_{03} & a_{02} & a_{01} & a_{00}+a_{03} \\ a_{02} & a_{01} & a_{00}+a_{03} & a_{02}+a_{03} \\ a_{01} & a_{00}+a_{03} & a_{02}+a_{03} & a_{01}+a_{02} \\ a_{00} & a_{03} & a_{02} & a_{01} \end{bmatrix} \cdot \begin{bmatrix} b_{00} \\ b_{01} \\ b_{02} \\ b_{03} \end{bmatrix}, \quad (31)$$

which requires 16 AND gates and 15 XOR gates, and has a delay of (one DAND+three DXOR). Since $\omega^{14}=\omega^3+1$ in GF($2^4$), $\forall\, B_i \in GF(2^4)$, $B_i*\omega^{14}$ is carried out as follows and requires only one XOR gate:

$$\begin{bmatrix} 1 & 0 & 0 & 0 \\ 0 & 0 & 0 & 1 \\ 0 & 0 & 1 & 0 \\ 1 & 1 & 0 & 0 \end{bmatrix} \begin{bmatrix} b_{i0} \\ b_{i1} \\ b_{i2} \\ b_{i3} \end{bmatrix}. \quad (32)$$

Figure 13A:
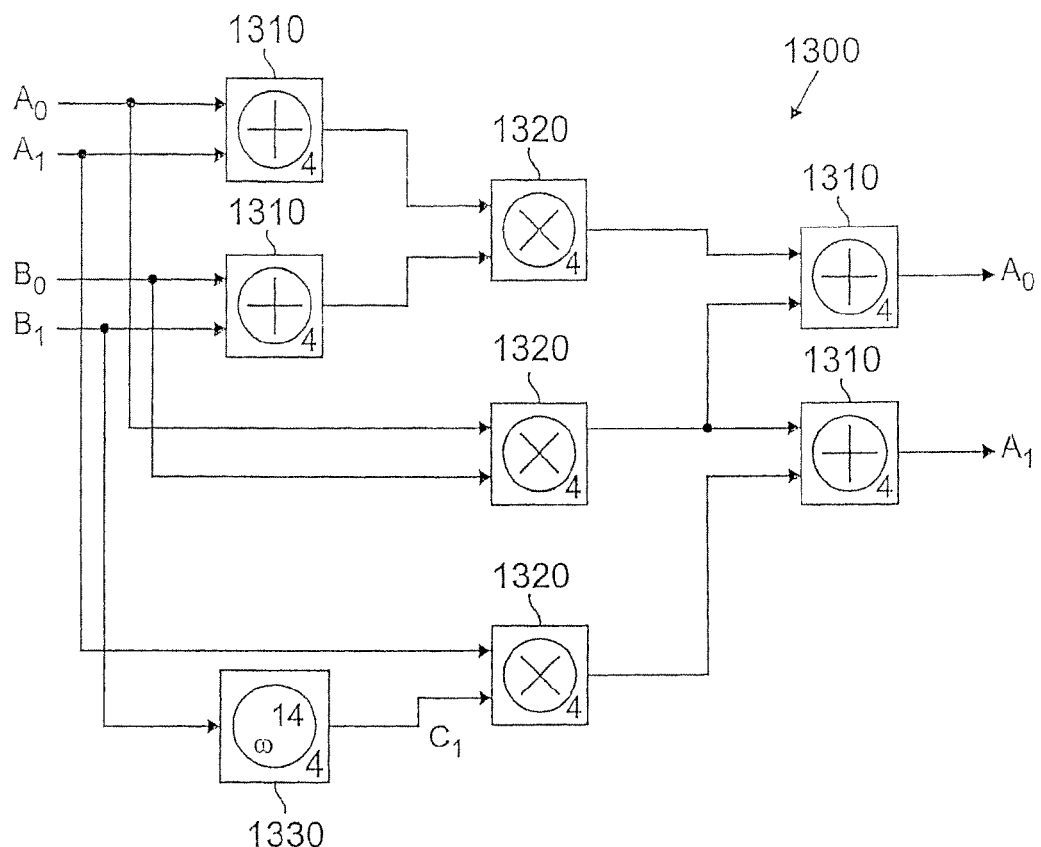
FIGS. 13A and 13B are diagrams of circuits used when performing a composite-basis multiplication, in accordance with a preferred embodiment of the invention.
Figure 13B:
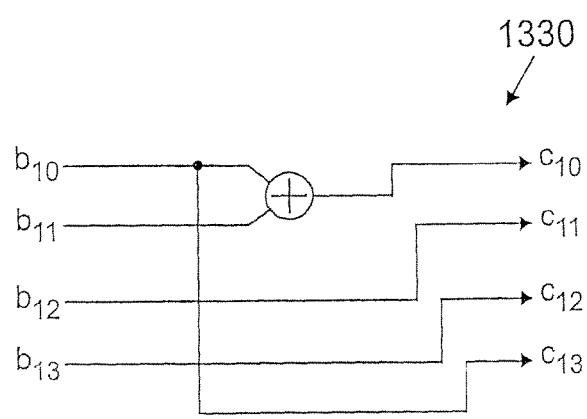

Essentially, the composite multiplication can be computed using 48 AND gates and 62 XOR gates, and has a computation delay of (one DAND+five DXOR ). Circuits for performing the multiplication of Equations (31) and (32) are shown in FIG. 13. FIG. 13A has a block diagram of a circuit 1300 for performing a composite-basis multiplication. Circuit 1300 comprises adders 1310 in GF($2^4$), multipliers 1320 in GF($2^4$), and a block 1330 that performs the multiplication in Equation (32). FIG. 13B illustrates a circuit 1330 for performing the multiplication $B_i*\omega^{14}$, as shown in Equation (32).

A problem with the composite-basis multiplication is that it requires basis conversion from GF($2^8$) to GF(($2^4)^2$) and vice versa. These basis conversions increase complexity over the Mastrovito standard-basis multiplier described above and also increases the cycle time required to perform the multiplication. Consequently, the Mastrovito standard basis multiplier is chosen over the composite-basis multiplier because of reduced complexity and higher speed.

Composite-Basis Divider

In general, division in the finite field GF($2^m$) can be computed using one of the following methods. First, division may be performed by using the Fermat theorem: $\forall\, A \in GF(2^2)$, $A^{2^m-1}=1$. Therefore $A^{-1}=A^{2^m-2}$, and it can be computed using multiplications. Second, division may be performed using the Euclidean algorithm for polynomials over GF(2). Finally, division may be performed by solving a linear system of equations over GF(2) using Gauss-Jordan elimination.

In decoding of RS(255, 239) code, division is required at the final stage of the RS decoder to compute the error magnitude (Forney's algorithm). As division is computationally intensive and time-consuming, it is important that circuits performing division are of low complexity yet of high speed. A divider in composite representation containing 107 AND gates and 122 XOR gates is by far the most simple divider circuit for GF($2^8$), and is described as follows. The division W=A/B, where $A=A_1y+A_0$, $B=B_1y+B_0$, and W are elements in GF(($2^4)^2$), can be computed as follows.

First, compute the following:

$$temp1=(A_0+A_1)*B_0+A_0*(B_0+B_1), \quad (33)$$

$$temp2=A_0*(B_0+B_1)+A_1*B_1*\Omega^{14}, \quad (34)$$

$$temp3=B_0*(B_0+B_1)+B_1^2*\Omega^{14}, \quad (35)$$

where "*" denotes the multiplication in GF($2^4$) and temp1, temp2, and temp3 are elements in GF($2^4$).

Next, compute the inverse of temp3. Let $B=b_3z^3+b_2z^2+b_1z+b_0$ denote the inverse of an element $A=a_3z^3+a_2z^2+a_1z+a_0$ in GF($2^4$). Then B can be computed using the following equations:

$$\begin{aligned} b_0 &= a_0+a_1+a_2+a_3+(a_0+a_1)\cdot a_2+a_1\cdot a_2\cdot(a_0+a_3),\; b_1=(a_0+a_1)\cdot a_2+a_1\cdot(a_0+a_3)+a_3+a_0\cdot a_1\cdot a_3,\; b_2=(a_2+a_3)+a_0\cdot (a_2+a_3)+a_0\cdot(a_1+a_2\cdot a_3),\; b_3=(a_2+a_3)+(a_0+a_1)\cdot a_3+a_2\cdot a_3+a_1\cdot(a_1+a_2\cdot a_3), \end{aligned} \quad (36)$$

which requires 11 AND gates and 14 XOR gates, and has a delay of (one DAND+three DXOR).

Finally, the quotient equals the following:

$$W_1=temp1*(temp3)^{-1},\; W_0=temp2*(temp3)^{-1}. \quad (37)$$

Figure 14B:
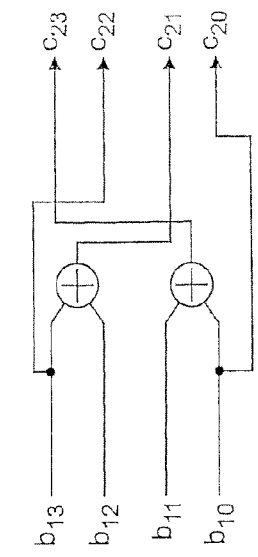
FIGS. 14A and 14B are diagrams of low complexity circuits used when performing a division, in accordance with a preferred embodiment of the invention.
Figure 14A:
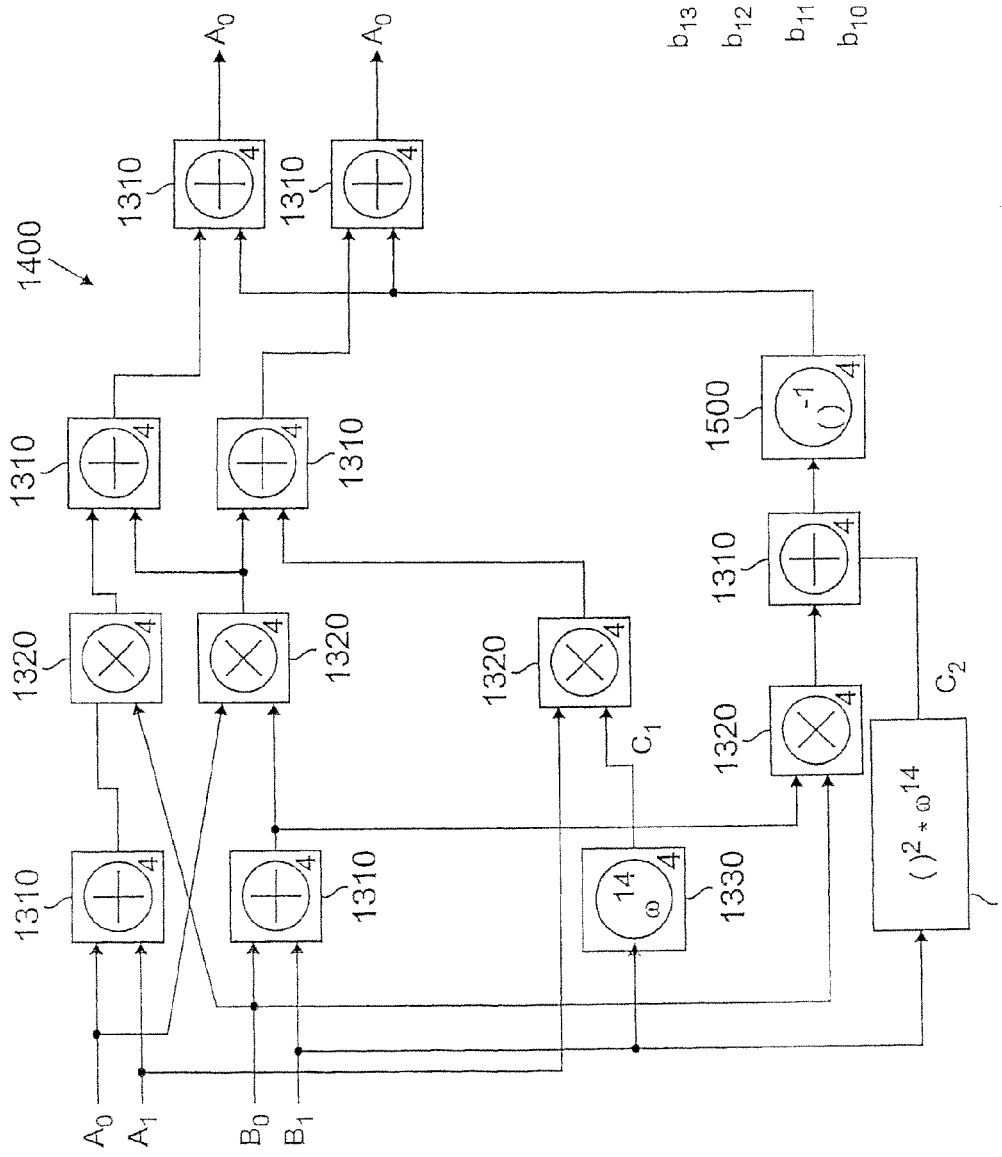
Figure 15:
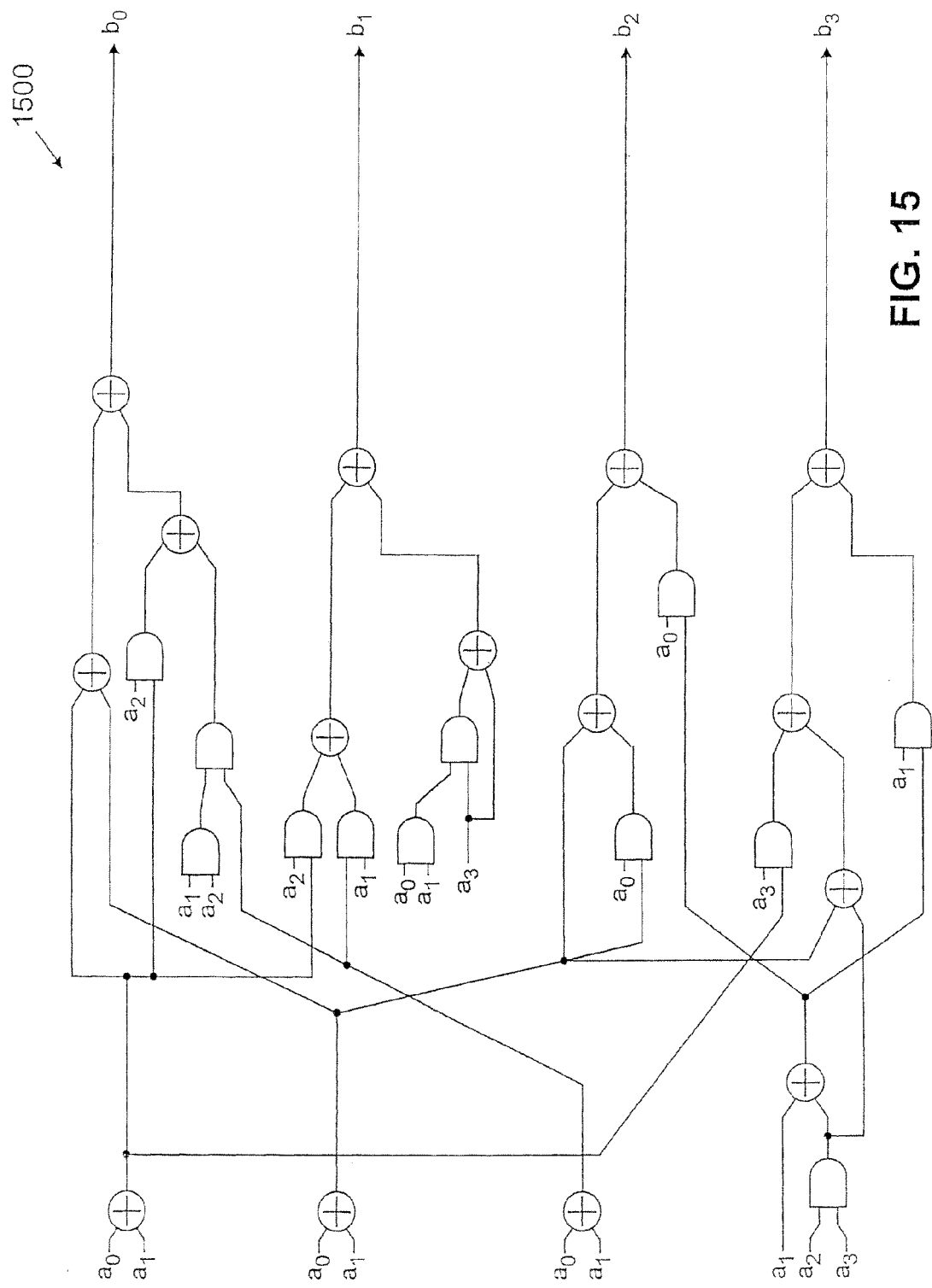
FIG. 15 is a low complexity inverter used in a circuit in FIG. 14A, in accordance with a preferred embodiment of the invention.

The block diagram of this dedicated divider is shown in FIG. 14A. It contains 107 AND gates and 122 XOR gates, and has a computation delay of (three DAND+nine DXOR). In FIG. 14A, a circuit 1400 for performing division comprises adders 1310 in GF($2^4$), multipliers 1320 in GF($2^4$), a multiplier block 1430, and an inverter 1500. Multiplier block 1430 is shown in more detail in FIG. 14B. Inverter 1500 is a low complexity inverter and is shown in more detail in FIG. 15.

Correction Value Output Interface

Figure 16:
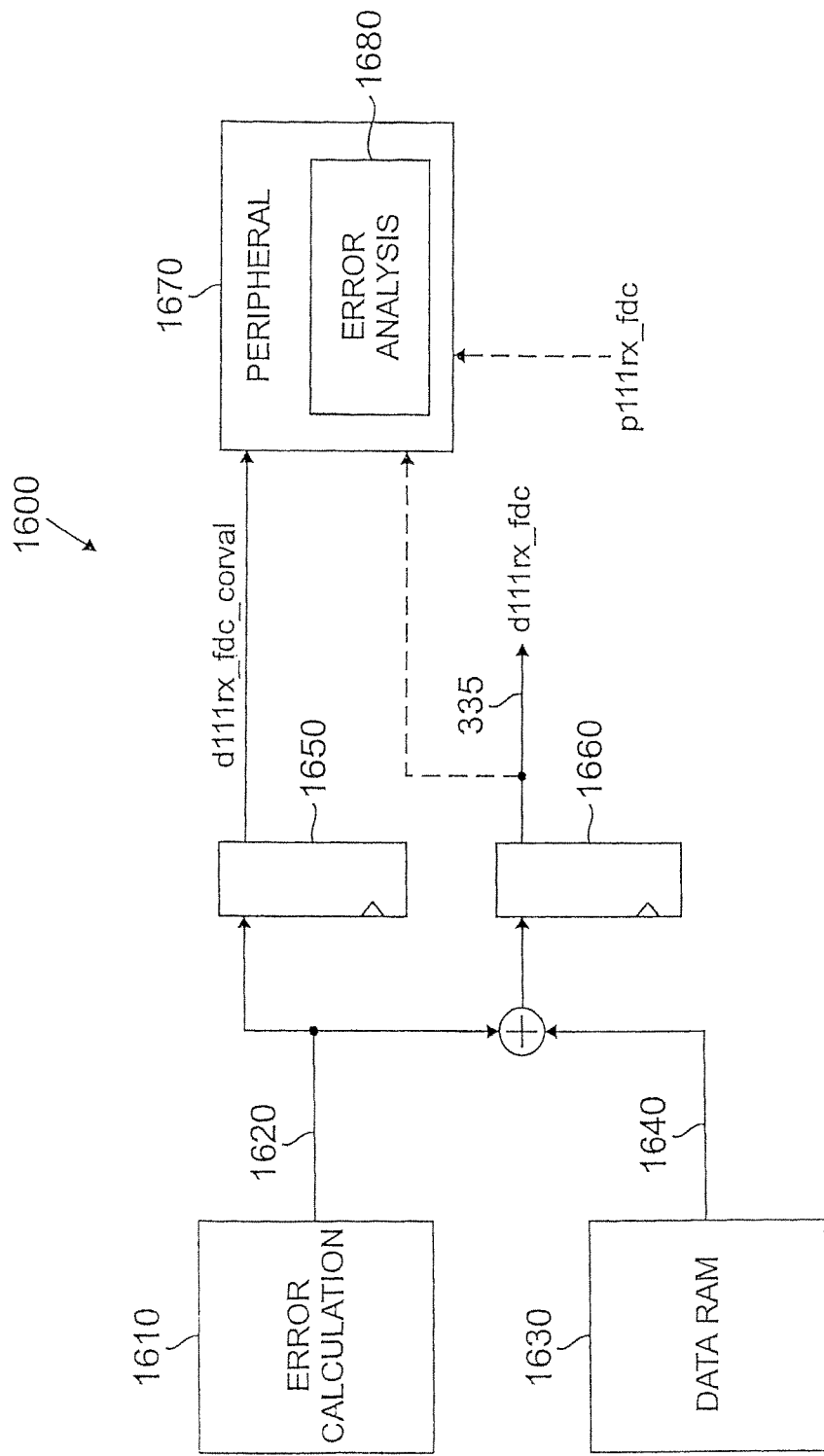
FIG. 16 is a portion of an FEC decoder, where the portion outputs a signal corresponding to errors in received data, in accordance with a preferred embodiment of the invention.

An important feature of the FEC decoder module is the output signal d111rx_fdc_corval, which can be used as an input into one or more peripheral modules. FIG. 16 shows a block diagram of a portion 1600 of an FEC decoder module. The portion 1600 is interfaced with a peripheral 1670 having an error analysis section 1680. Portion 1600 comprises error calculation block 1610, data Random Access Memory (RAM) 1640, an XOR 1645, and registers 1650 and 1660. Error calculation 1610 holds the output of Forney's algorithm. Error calculation output 1620 is 384 bits wide and holds error values in their appropriate locations. Data RAM 1630 holds the received data. Data RAM output 1640 is also 384bits wide and holds 48 bytes, three bytes from each of the 16 received blocks. XOR 1645 performs a bit-wise XOR operation. Register 1660 holds the result of the bit-wise XOR operation, which is the corrected data. Register 1660 outputs this data every cycle. Register 1650 contains the error values in their appropriate locations and outputs this information as d111rx_fdc_corval. Note that registers 1650/1660 are application specific and can be used in order to relax timing specifications.

Peripheral 1670 can be used to perform error analysis on the received data. This error analysis is performed in error analysis block 1680. Error analysis block 1680 can determine whether the errors are burst or random errors, bit error rates, and trends in the error rates. Error analysis block 1680 creates error statistics and can optionally derive control information for external high-speed or optical components.

Optionally, p111rx_fdc and d111rx_fdc may be input to the peripheral 1670. The signal p111rx_fdc is used to indication the start of an output FEC block and can be used to determine when an FEC block begins. This allows the calculation of block bit error rates. The signal d111rx_fdc, which contains the corrected output data, may also be input into the peripheral 1670 to allow analysis of the types of errors (e.g., more ones being changed to zeros than vice versa).

Detection of Uncorrectable Errors

With a hard-decision algebraic decoding scheme, an RS(255,239) code is unable to correct more than eight symbol errors. When these uncorrectable errors occur, a typical decoding process could either generate a non-code-word output sequence, or "correct" the received sequence to another codeword. The former case is referred to as a decoding failure, and the latter is called a decoding error.

In both cases, the decoder adds additional errors to the received sequence. Hence, it is desirable for the decoder to detect the uncorrectable blocks and output the incoming sequence unaltered. Generally, decoder errors are hard to detect. For RS codes over $GF(2^m)$ with relatively large values of m and t, it is very likely that more than 90 percent of the cases decoding of an uncorrectable block result in detectable decoding failures. In particular, the RS(255,239) code over $GF(2^8)$ can detect almost all uncorrectable errors.

Detection of decoding failure can be performed by re-calculating the syndromes of the decoder output sequence. A failure is then detected if not all the syndrome values equal zero. On the other hand, detection of decoding failure can also be performed during the Chien's search. The current block is flagged as uncorrectable if either (1) during the Chien's search, it is found that the error locator polynomial $\Lambda(x)$ has multiple roots; or (2) upon completion of Chien's search, the total number of symbol errors found is less than the degree of $\Lambda(x)$. Since the Chien's search covers all the elements in $GF(2^m)$, this indicates that not all the roots of $\Lambda(x)$ are in the Galois field $GF(2^8)$, which can only happen when more than eight symbol errors occur.

Since the degree of $\Lambda(x)$ is no greater than eight, this scheme requires only a four-bit accumulator and a four-bit comparator, which is much simpler than re-computing the syndromes. This saves both complexity and time. A modified Chien's search circuit 1700 is shown in FIG. 17. This circuit comprises a computation block 1705, an adder 1710, two zero decision blocks 1715 and 1720, two ANDs 1725 and 1730, an adder 1735, an error counter 1740, an OR 1750, a degree decision block 1760, and a degree computation block 1770. Normally, a Chien's search circuit would contain computation block 1705, adder 1710, two zero decision blocks 1715 and 1720, AND 1730, adder 1735, and error counter 1740. The devices added to perform the modified Chien's search are the AND 1725, OR 1750, degree decision block 1760, and degree computation block 1770.

As described above, there are two ways for modified Chien's search circuit 1700 to report an error. If both $\Lambda 0 + \Lambda 1$ and $\Lambda 1$ are zero, then $\Lambda(x)$ has multiple roots. This causes an error. Additionally, if degree decision block 1760 determines that the number of errors is less than the $\deg(\Lambda(x))$, then a decoding failure is flagged. Degree computation block 1770 finds the leading nonzero coefficient of $\Lambda(x)$ to determine its degree, and the degree decision block 1760 is a four-bit comparator that compares the number of errors with the $\deg(\Lambda(x))$.

The signal d111rx_fdc_errovfl (see FIGS. 5 and 6) indicates how many uncorrectable blocks there were during a single frame, and will be a value derived from 16 of the circuits 1700. Note that the signal d111rx_fdc_errovfl can also be output to peripheral 1670 (see FIG. 16), if desired. The signal d111rx_fdc_errovfl is reset before a new frame is decoded.

It is worth mentioning that the latter simplified scheme only covers some sufficient condition of decoding failure, and it is possible to miss flagging some uncorrectable blocks. Simulation results show that for RS codes over smaller Galois fields and with smaller value of t, the latter scheme is inferior; however, for RS(255,239) code, it is as robust as the syndrome based approach.

Thus, the decoder module 310 provides a three-parallel architecture and additional enhancements that provide high speed yet relatively low complexity, power, and cost.

Encoder Module

Figures 18, 19:
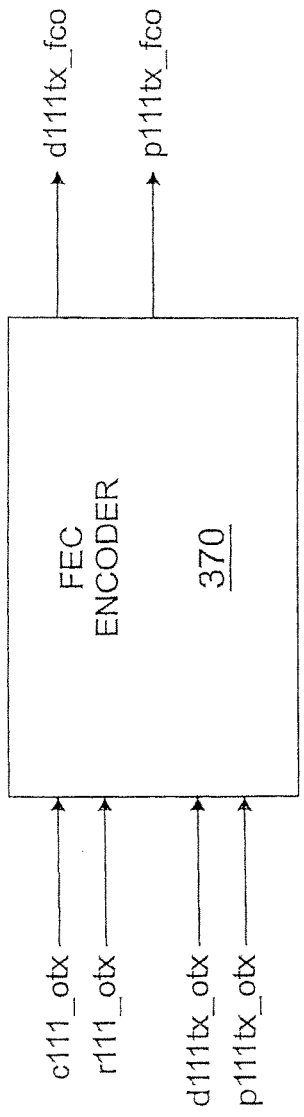
FIG. 18 is an input/output interface for an FEC encoder, in accordance with a preferred embodiment of the invention.
FIG. 19 contains a description of the input/output signals shown in FIG. 18, in accordance with a preferred embodiment of the invention.

Referring now to FIG. 18, an FEC encoder 370 is shown. The FEC encoder 370 comprises inputs c111_otx, r111_otx, d111tx_otx, and p111tx_otx and outputs d111tx_fco, and p111tx_fco. These signals are described in more detail in FIG. 19.

Basically, the FEC encoder 370 accepts the incoming data stream (i.e., d111tx_otx), which is a 384 bits wide word with a clock rate of 111 MHz, and divides the data into three sets of 16 bytes in order to encode the 16 subframes of one FEC frame via a parallel three-symbol processing. Every clock cycle, the FEC encoder 370 reads three sets of 16 bytes of the data word, which represents 238 payload bytes and one addition overhead byte. The basic structure of an FEC frame is described in FIG. 4 and associated text. The 239 bytes of input are input to the FEC encoder 370, a process that takes 80 clock cycles. During the first clock cycle of an input data frame, one overhead byte and two payload bytes are input. During the eightieth clock cycle of an input data frame, two payload bytes are input and the third byte is a don't care byte. Don't care bytes are internally set to zero, thus not contributing to the redundancy byte calculations. The next five cycles also are don't care cycles for the input. These cycles will hold, on the output, the redundancy bytes.

Figure 20:
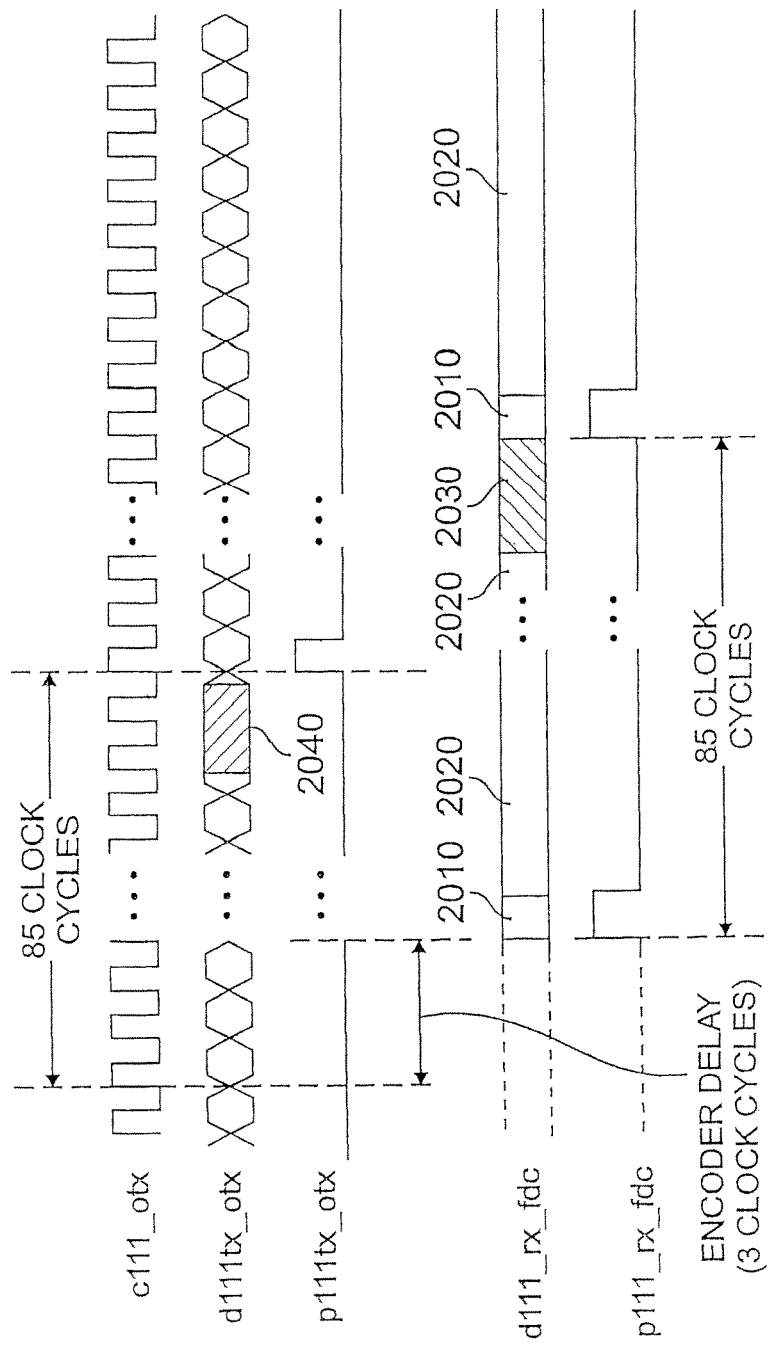
FIG. 20 is a timing diagram of the FEC encoder shown in FIG. 18, in accordance with a preferred embodiment of the invention.

A timing diagram for the FEC encoder 370 is shown in FIG. 20. The FEC encoder 370 outputs an encoded codeword, which is 238 bytes of payload, one additional overhead byte, and 16 bytes of parity check bytes. After a certain amount of encoder delay, the FEC encoder 370 outputs the frame protocol overhead, e.g., frame alignment word 2010, then outputs the 238 bytes of payload 2020, and then outputs the parity check bytes 2030. Area 2040 is a don't care area, which is essentially filled on the output of the FEC encoder 370 with redundancy bytes.

EXAMPLE SONET SYSTEM

An exemplary architectural design and implementation result of an RS encoder and decoder in accordance with the invention for a 40 Gb/s Synchronous Optical NETwork (SONET) system is now described. In order to achieve 40 Gb/s data throughput rate, a clock frequency of 334 MegaHertz (MHz) would be required for serial encoding and decoding of a 16-way interleaved RS(255,239) code over $GF(2^8)$. As previously described, instead of serial encoding and decoding at such a high operating clock speed, both the encoder and decoder in the present invention process three symbols per code block per cycle and operate at a clock rate of approximately 111 MHz.

Figure 21:
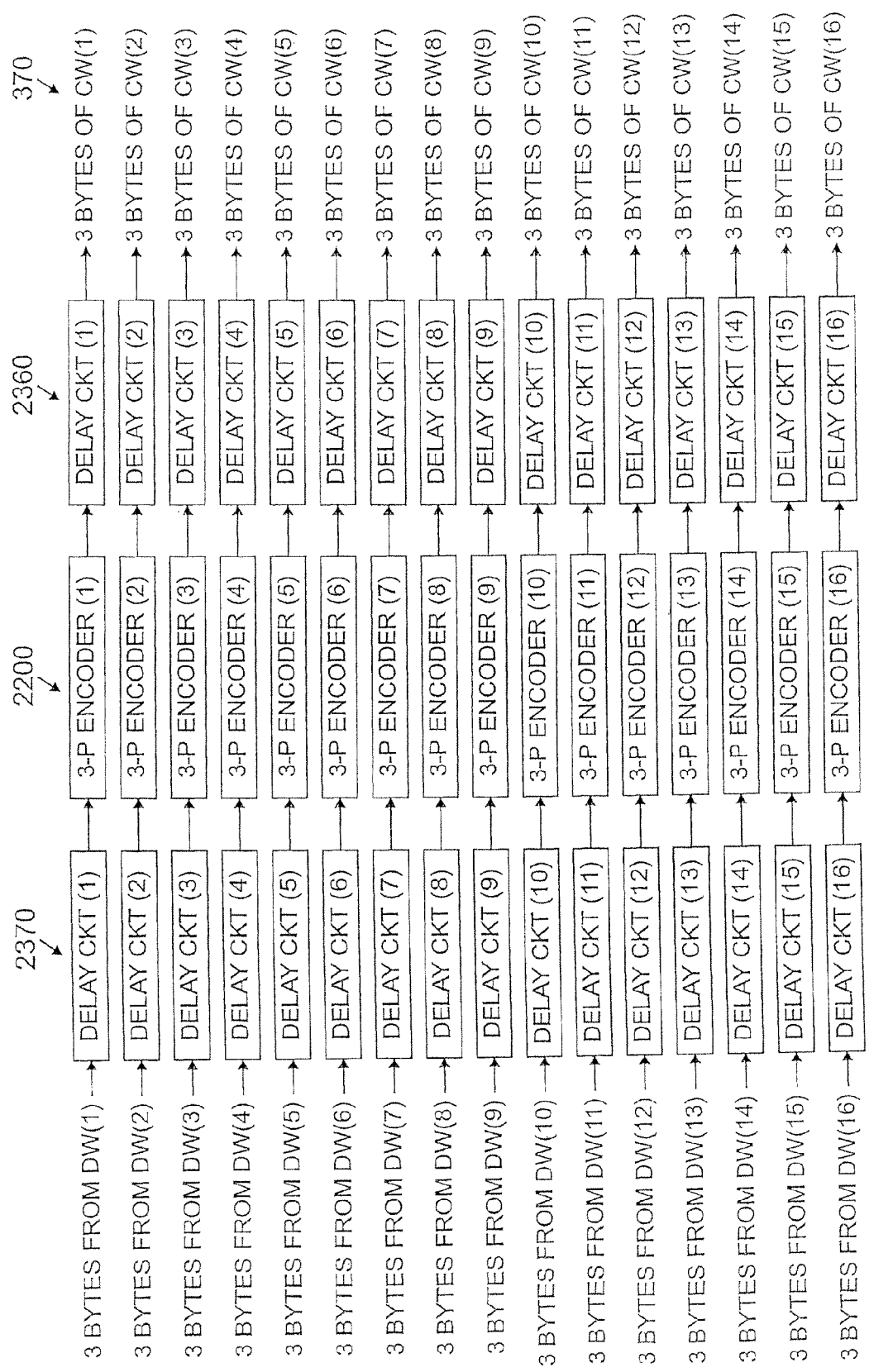
FIG. 21 is a block diagram of an FEC encoder shown in FIG. 18, in accordance with a preferred embodiment of the invention.

A more detailed block diagram of the FEC encoder 370 is shown in FIG. 21. FEC encoder 370 comprises 16 delay circuits 2370, 16 three-parallel encoders 2200, and 16 second delay circuits 2360. When running, during every clock cycle the FEC encoder 370 processes 48 bytes in parallel and produces 48 bytes of output. Each group of two delays 2370, 2360 and one three-parallel encoder 2200 will process three bytes from one data word. Each group will output three bytes of a codeword. Each data word contains 239 data bytes, of which one byte is overhead and 238 bytes are payload bytes.

Each codeword contains 255 bytes, of which one byte is overhead and 238 bytes are payload bytes from the data word, and 16 bytes are parity check bytes. As described in more detail below, the first 239 bytes of a data word are input to a group then zeros are input to the group and the parity check bytes are read out. While the first 239 bytes of a data word are input to a group, the same 239 bytes are output from the group after a delay.

The encoding for each three-parallel encoder 2200 will now be described. The encoding procedure for three-parallel RS(255, 239) code can be derived from Equation (3) as follows. Let G(x) be the generator polynomial shown in Equation (5). Since 239 is not a multiple of three, it is assumed that there is a zero padded at the beginning of each information block. Then the three-parallel RS encoding, starting from the higher order symbols, can be performed as shown below:

$$U(x) \cdot x^{16} \bmod G(x) = \quad (38)$$

$$\left\{ \left[ \ldots \{[(0 \cdot x^{18} + u_{238} \cdot x^{17} + u_{237} \cdot x^{16}) \bmod G(x)_0] \cdot x^3 + \underline{(u_{236} \cdot x^{18} + u_{235} \cdot x^{17} + u_{234} \cdot x^{16}) \bmod G(x)_1} \right\} \cdot x^3 + \ldots \right] \cdot x^3 + (u_2 \cdot x^{18} + u_1 \cdot x^{17} + u_0 \cdot x^{16}) \bmod G(x)_{79} \right\}$$

where the underlined computations are carried out in the i-th cycle, for $0 \leq i \leq 79$. Define the following polynomials:

$$g_0(x) = x^{16} \bmod G(x) \quad (39)$$
$$g_0(x) = \alpha^{120} x^{15} + \alpha^{104} x^{14} + \alpha^{107} x^{13} + \alpha^{109} x^{12} + \alpha^{102} x^{11} + \alpha^{161} x^{10} + \alpha^{76} x^9 + \alpha^3 x^8 + \alpha^{91} x^7 + \alpha^{191} x^6 + \alpha^{147} x^5 + \alpha^{169} x^4 + \alpha^{182} x^3 + \alpha^{194} x^2 + \alpha^{225} x + \alpha^{120}$$

$$g_1(x) = x^{17} \bmod G(x) \quad (40)$$
$$g_1(x) = \alpha^{138} x^{15} + \alpha^{229} x^{14} + \alpha^{18} x^{13} + \alpha^{114} x^{12} + \alpha^{92} x^{11} + \alpha^{28} x^{10} + \alpha^{31} x^9 + \alpha^{126} x^8 + \alpha^{233} x^7 + \alpha^{10} x^6 + \alpha^{53} x^5 + \alpha^{240} x^4 + \alpha^{100} x^3 + \alpha^{173} x^2 + \alpha^{156} x + \alpha^{240}$$

$$g_2(x) = x^{18} \bmod G(x) \quad (41)$$
$$g_2(x) = \alpha^{155} x^{15} + \alpha^{32} x^{14} + \alpha^{170} x^{13} + \alpha^{251} x^{12} + \alpha^{106} x^{11} + \alpha^{130} x^{10} + \alpha^{46} x^9 + \alpha^{160} x^8 + \alpha^{199} x^7 + \alpha^{63} x^6 + \alpha^{16} x^5 + \alpha^{50} x^4 + \alpha^{226} x^3 + \alpha^{251} x^2 + \alpha^{168} x + \alpha^3$$

Figure 22:
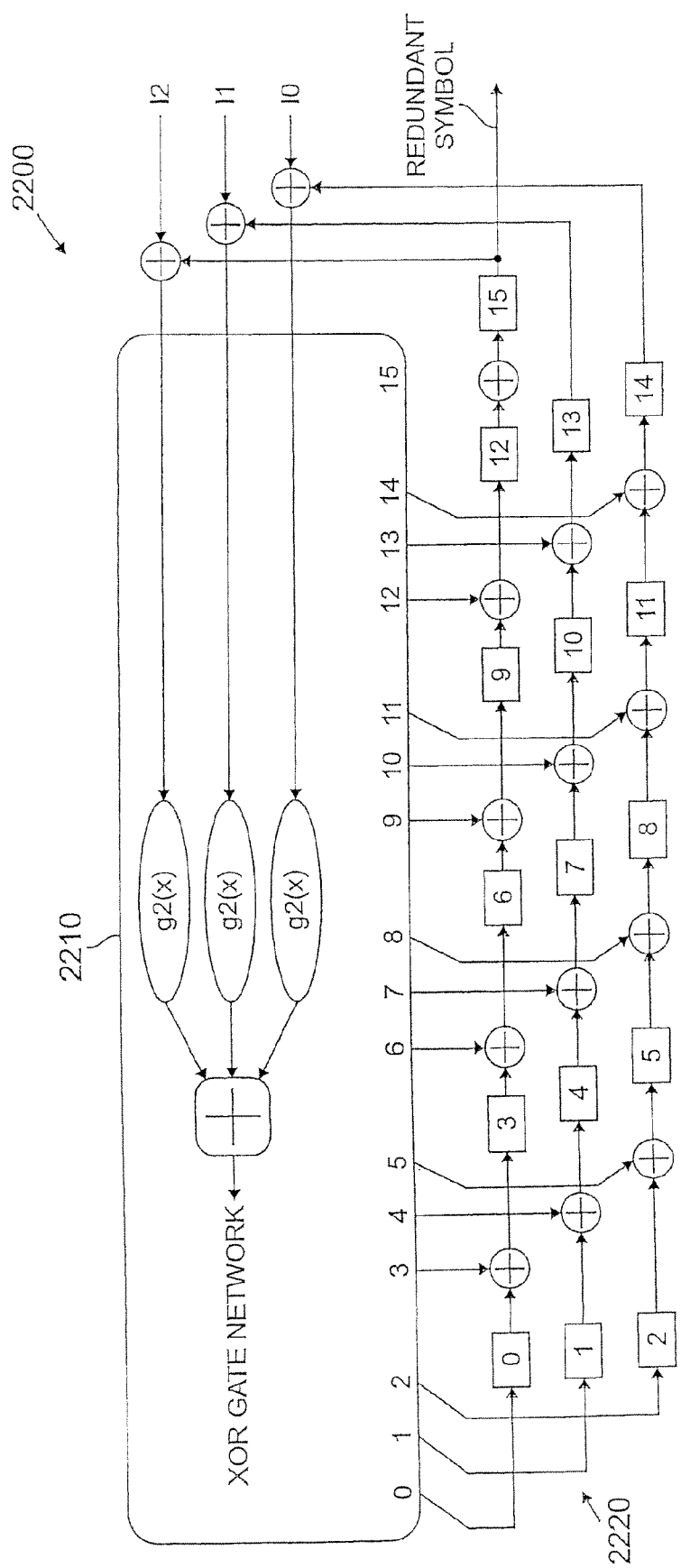
FIG. 22 is a block diagram of a three-parallel encoder in accordance with a preferred embodiment of the invention.

A block diagram of one three-parallel RS encoder 2200 is shown in FIG. 22. The circuit 2200 of FIG. 22 implements Equation (38) by using Equations (39), (40), and (41), and the constant multipliers in these equations are hardwired into an XOR network 2210. In FIG. 22, it can be seen that three input symbols, $I_0$, $I_1$, and $I_2$, are input to the RS encoder 2200. These input symbols, $I_0$, $I_1$, and $I_2$, are multiplied by the appropriate polynomials, $g_0(x)$, $g_1(x)$, and $g_2(x)$, respectively, in the XOR network 2210, and the additions shown by reference numeral 2220 are performed. For example, the content of registers is added to the content at location 3 from the XOR network 2210 and the result is placed in register$_3$. Similarly, the content of register$_3$ is added to the content at location 6 from the XOR network 2210 and the result is placed in register$_6$.

As the incoming data to the RS encoder 2200 is assumed to have 239 information symbols followed by 16 zero symbols, i.e., a zero symbol is actually padded at the end of the incoming information sequence instead of the beginning as required by Equation (38), the incoming data needs to be buffered and reformatted to suit Equation (38).

Figure 23:
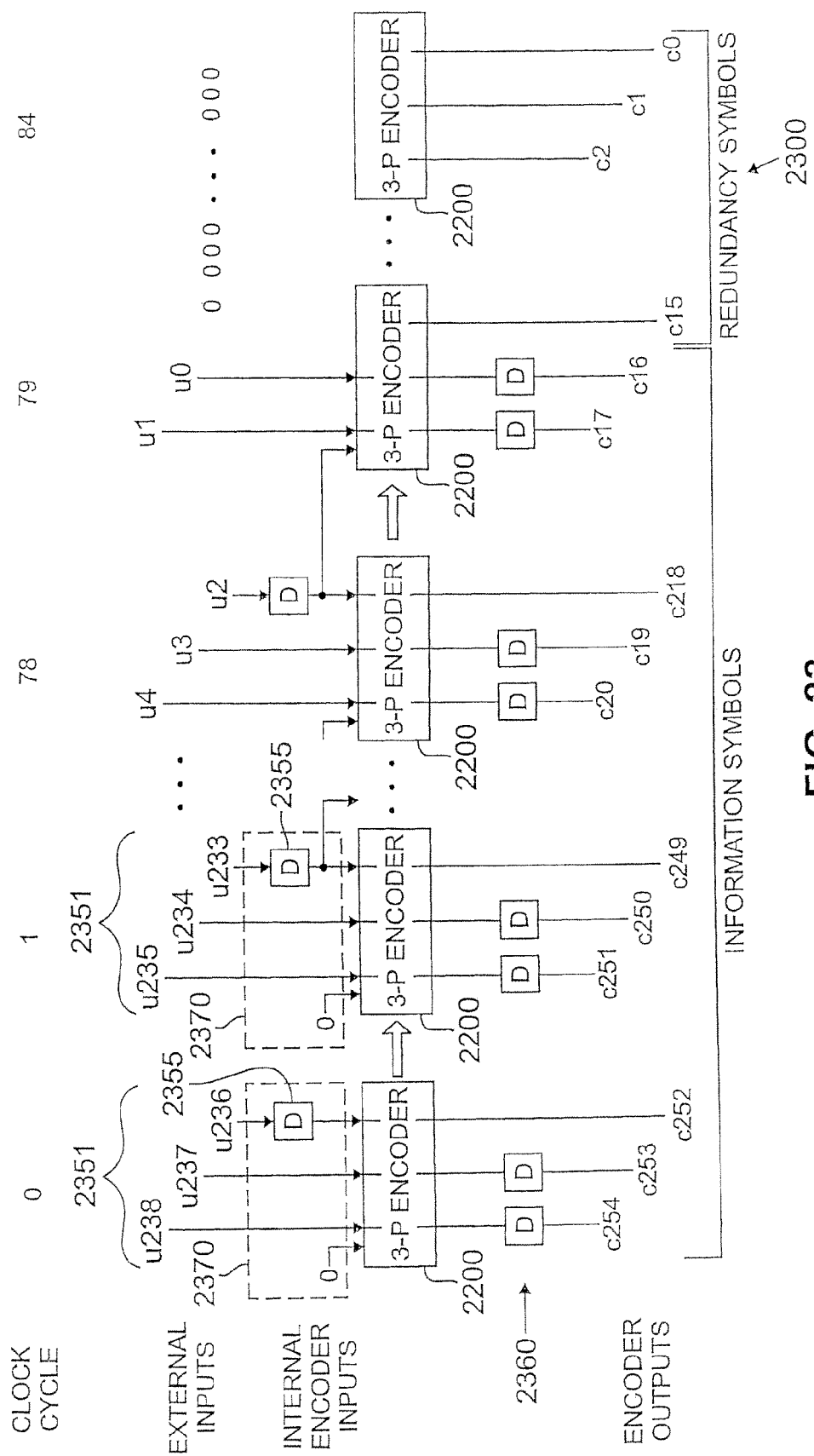
FIG. 23 is a block diagram of a conversion sequence used to convert incoming data to a format suitable to create a Reed-Soloman (RS) (255,239) code, in accordance with a preferred embodiment of the invention.

The conversion sequence 2300 for performing buffering and reformatting is shown in FIG. 23. Sequence 2300 takes care of the format difference by delaying the processing of the last received symbol to the next cycle. Sequence 2300 works as follows. From the system level, the external inputs 2351 (i.e., $u_{238}$, $u_{237}$, and $u_{236}$) are available during the first cycle (i.e., cycle 0 in FIG. 23). However, the first term of Equation (38) is the following: $(0 \cdot x^{18} + u_{238} \cdot x^{17} + u_{237} \cdot x^{16})$. This means that the available symbols 2351 are not the appropriate symbols to meet the requirements of Equation (38). Additionally, the next term of Equation (38) is $(u_{236} \cdot x^{18} + u_{235} \cdot x^{17} u_{234} \cdot x^{16})$, which means that $u_{236}$ is needed for the second cycle (i.e., cycle 1 of FIG. 23), but not for the first cycle.

To solve this dilemma, in addition to three-parallel encoder 2200, there is also a delay 2355 that delays $u_{236}$ one cycle. Delay 2355 is part of delay circuit 2370. Additionally, circuit 2370 inputs a zero as the highest order symbol in cycle 0. Thus, in cycle 0, the three-parallel encoder 2200 is used to properly calculate $(0 \cdot x^{18} + u_{238} \cdot x^{17} + u_{237} \cdot x^{16})$. Three-parallel encoder 2200 passes $u_{238}$ and $u_{237}$, but these are delayed, using delays 2360, so that $u_{238}$, $u_{237}$, and $u_{236}$ arrive unchanged out of the encoder 2300 at the same time (as $c_{254}$, $c_{253}$, and $c_{252}$), which occurs during cycle 1. Also during cycle 1, the information symbols $u_{235}$, $u_{234}$, and $u_{233}$ are received, $u_{233}$ is delayed, and the $(u_{236} \cdot x^{18} + u_{235} \cdot x^{17} + u_{234} \cdot x^{16})$ calculation is performed. This process continues for 79 cycles, at which time all redundancy symbols have been calculated by the three-parallel encoder 2200. Note that one redundancy symbol, $c_{15}$, is output during cycle 79. The rest of the redundancy symbols merely have to be read out of three-parallel encoder 2200. This is performed by inputting zero symbols into the encoder 2200 for five cycles and retrieving the other 15 redundancy symbols, $c_{14}$ through $c_0$. Circuit 2370 is used to input zeros for the appropriate number of cycles. Optionally, a system (not shown) into which three-parallel encoder 2200 is placed can input zeros into circuit 2370.

It should be noted that conversion sequence 2300 is performed as described above to reduce complexity. If the last received symbol is not delayed to the next cycle, the complexity of an encoder will increase beyond the complexity shown in FIG. 23. Consequently, conversion sequence 2300 reduces complexity and yet still maintain adequate throughput.

Thus, what has been shown is a system and encoders and decoders that provide high speed encoding and decoding yet provide reduced power, complexity, and cost. The present invention has been described through reference to symbols that are one byte long. However, other symbol sizes may be used. In addition, although described with reference to three-parallel decoding, the invention is more generally applicable to N-parallel decoding, where N is an integer greater than or equal to two.

It is to be understood that the embodiments and variations shown and described herein are merely illustrative of the principles of this invention and that various modifications may be implemented by those skilled in the art without departing from the scope and spirit of the invention.

We claim:
1. A communication system, comprising:
a decoder system comprising:
a plurality of N-parallel syndrome generators, each of the N-parallel syndrome generators coupled to a parallel input data stream and being adapted to perform a calculation each cycle with N symbols from the input parallel data stream;

a plurality of key equation determination devices, each key equation determination device coupled to at least one of the N-parallel syndrome generators and being adapted to determine at least one error polynomial;

a plurality of N-parallel error determination and correcting devices, one for each of the N-parallel syndrome generators, each N-parallel error correction and determination device coupled to one of the key equation determination devices and being adapted to use the at least one error polynomial produced by the one key equation determination device to correct errors in the parallel input data stream; and an encoder system coupled to the decoder system and comprising:

a plurality of N-parallel encoders, each of the N-parallel encoders adapted to accept N symbol inputs, in parallel, during a cycle and produce, in parallel, N symbol outputs during a cycle, and wherein each N-parallel encoder is adapted to produce a plurality of redundancy symbols after a predetermined number of input symbols have been input to the encoder, wherein said N symbol inputs comprise a plurality of input bits, wherein said plurality of redundancy symbols comprise a plurality of output bits, wherein each N-parallel encoder comprises an input delay unit and an output delay unit, wherein each input delay unit delays only a subset of said plurality of input bits, and wherein each output delay unit delays only a subset of said plurality of output bits; and a device coupled to the N-parallel encoders and adapted to create an M-parallel frame, the M-parallel frame adapted to hold a plurality of codewords, each codeword comprising a plurality of symbols.

2. The communication system of claim 1, wherein N is three, wherein the encoder is adapted to encode 40 gigabits per second (Gb/s), and wherein the decoder is adapted to decode 40 Gb/s.

3. The communication system of claim 1, wherein the system is part of a Synchronous Optical Network (SONET), wherein the decoder of the system is coupled to an optical receiver and the encoder is coupled to an optical transmitter, the optical receiver converting an optical data stream into a serial input data stream, the decoder further comprising a device adapted to convert the serial input data stream into the parallel input data stream, the encoder further comprising a device adapted to convert symbols from the N-parallel data stream to a serial output data stream that is coupled to the optical transmitter.

4. The communication system of claim 1, further comprising a second device coupled to the M-parallel frame and adapted to create a serial data stream from a plurality of symbols in the M-parallel frame.

5. The communication system of claim 1, wherein said encoder further comprises a third device adapted to create frame alignment information, the frame alignment information passed through one of the N-parallel encoders and placed at a beginning of the M-parallel frame.

6. The communication system of claim 1, wherein said encoder further comprises a third device coupled to the second device and being adapted to create a parallel data stream having a width of 48 symbols, wherein the encoder outputs 48 symbols per clock cycle and wherein N=3 and M=16.

* * * * *